US008835771B2

(12) United States Patent
Masago et al.

(10) Patent No.: US 8,835,771 B2
(45) Date of Patent: Sep. 16, 2014

(54) PCB TERMINAL AND METHOD FOR MANUFACTURING THE SAME

(75) Inventors: Yasushi Masago, Shimonoseki (JP); Koichi Taira, Shimonoseki (JP); Toshiyuki Mitsui, Kitakyushu (JP); Junichi Kakumoto, Kitakyushu (JP); Masayasu Nishimura, Kitakyushu (JP)

(73) Assignee: Kobe Steel, Ltd., Kobe-shi (JP)

( * ) Notice: Subject to any disclaimer, the term of this patent is extended or adjusted under 35 U.S.C. 154(b) by 503 days.

(21) Appl. No.: 13/312,546

(22) Filed: Dec. 6, 2011

(65) Prior Publication Data

US 2012/0138330 A1 Jun. 7, 2012

(30) Foreign Application Priority Data

Dec. 7, 2010 (JP) ................................ 2010-272088

(51) Int. Cl.

| | |
|---|---|
| ***H05K 1/02*** | (2006.01) |
| ***H01R 12/55*** | (2011.01) |
| ***H01R 13/03*** | (2006.01) |
| ***C25D 5/10*** | (2006.01) |

(52) U.S. Cl.

CPC ................ *H01R 12/55* (2013.01); *H01R 13/03* (2013.01); *C25D 5/10* (2013.01)

USPC ......... 174/257; 174/256; 174/250; 174/126.2

(58) Field of Classification Search

CPC .......... C25D 5/10; H01R 12/55; H01R 13/03; H01R 43/16; C23C 28/021

USPC .................... 174/126.1–126.2, 250, 256, 257

See application file for complete search history.

(56) References Cited

U.S. PATENT DOCUMENTS

| | | | | |
|---|---|---|---|---|
| 6,939,621 | B2 * | 9/2005 | Hara et al. | 428/647 |
| 7,700,883 | B2 * | 4/2010 | Masago et al. | 174/126.2 |
| 7,820,303 | B2 * | 10/2010 | Suzuki et al. | 428/647 |
| 7,871,710 | B2 * | 1/2011 | Masago et al. | 428/647 |
| 8,076,582 | B2 * | 12/2011 | Masago et al. | 174/126.2 |
| 8,445,057 | B2 * | 5/2013 | Suzuki et al. | 427/123 |
| 2008/0090096 | A1 | 4/2008 | Suzuki et al. | |
| 2008/0188100 | A1 * | 8/2008 | Saitoh | 439/82 |
| 2008/0257581 | A1 | 10/2008 | Masago et al. | |
| 2010/0163277 | A1 | 7/2010 | Masago et al. | |
| 2010/0304016 | A1 | 12/2010 | Suzuki et al. | |

FOREIGN PATENT DOCUMENTS

| | | |
|---|---|---|
| JP | 5-82201 | 4/1993 |
| JP | 2004-300524 | 10/2004 |
| JP | 2005-105307 | 4/2005 |
| JP | 2005-183298 | 7/2005 |

(Continued)

*Primary Examiner* — Hoa C Nguyen
*Assistant Examiner* — Amol Patel
(74) *Attorney, Agent, or Firm* — Oblon, Spivak, McClelland, Maier & Neustadt, L.L.P.

(57) ABSTRACT

The invention forms a Sn coating layer and a Cu—Sn alloy coating layer having a suitably controllable planar shape in a PCB terminal. A group of Sn coating layers being as a plurality of essentially parallel lines is formed as the surface coating layer, and a Cu—Sn alloy coating layer 2 is exposed on the outermost surface on both sides of Sn coating layers each constituting the group of Sn coating layers. The Sn coating layers have a width of 1 to 500 μm, an interval between adjacent Sn coating layers is 1 to 20000 μm, and an outermost maximum height roughness in a terminal insertion direction is at most 10 μm.

35 Claims, 11 Drawing Sheets

(56) References Cited

FOREIGN PATENT DOCUMENTS

| | | | |
|---|---|---|---|
| JP | 3926355 | | 3/2007 |
| JP | 2007-258156 | | 10/2007 |
| JP | 4024244 | | 10/2007 |
| JP | 2008-269999 | | 11/2008 |
| JP | 2008-274364 | | 11/2008 |
| WO | WO 2008/072418 | A1 | 6/2008 |

* cited by examiner (a)

(b)

(a)

(b)

(a)

(b)

(a)

(b)

(c)

(a)

(b)

PCB TERMINAL AND METHOD FOR MANUFACTURING THE SAME

BACKGROUND OF THE INVENTION

1. Field of the Invention

The present invention relates to a PCB terminal mostly used in electric wirings of automobiles and other consumer devices and a method for manufacturing the PCB terminal, more particularly to a PCB terminal required to fulfill the demands for friction and wear reduction when inserted in and pulled out from a female terminal in a fitting portion and also required to have good solderability to a circuit board in a soldering portion, and a method for manufacturing such a PCB terminal.

2. Description of Related Art

PCB connectors are often used in ECU (engine control unit) of automobiles and electronic control circuit boards of consumer devices. The PCB connector serves to connect PCB (printed circuit board) and a female connector including female terminals. The PCB connector is embedded with a large number of PCB terminals. The PCB terminal includes a fitting portion on one end, a soldering portion provided on the other end, and an intermediate portion situated between the fitting portion and the soldering portion. Conventionally, the PCB terminals are inserted in a predetermined number of insertion holes formed in a box-shaped cabinet made of resin, and the cabinet is immovably set at intermediate portions of the PCB terminals to be used as a PCB connector. The fitting portions of the PCB terminals are fitted in the female terminals housed in the female connector. The soldering portions of the PCB terminals are inserted in through holes formed in the printed circuit board and soldered thereto.

International Publication WO2008-072418 discloses a PCB terminal wherein a surface coating layer made of Ni plating layer/Cu—Sn alloy layer/Sn plating layer (in the mentioned order from the side of materials, the same shall apply hereinafter) is formed on the fitting portion, a surface coating layer made of Ni plating layer/Sn—Ni alloy layer/Sn plating layer is formed on the soldering portion, and a surface coating layer made of one of an Ni plating layer, an Ni—Sn alloy layer, and a Cu—Sn alloy layer is formed on the intermediate portion. When the surface coating layers are thus provided, the fitting portion can achieve a low contact resistance and a low insertion and extraction force, the soldering portion can provide favorable solderability, and the intermediate portion can effectively prevent occurrence of solder wicking. International Publication WO2008-072418 also discloses a manufacturing method wherein a base material is die-cut into a predetermined terminal shape, and the fitting portion, soldering portion, and intermediate portion are then respectively subjected to after-plating as required and then subjected to a reflow treatment.

Japanese Unexamined Patent Publication No. 05-82201 discloses a terminal constituting a conventional surface mounting connector wherein the terminal is formed in a substantially L shape and has a semi-circular bent portion at an upper end thereof. An upper-end side is a contact portion, while a lower-end side thereof is a portion to be connected to a circuit board. When the contact portion elastically contacts another terminal and the portion to be connected to the circuit board is soldered to the circuit board, the terminal is electrically connected to another terminal or the circuit board. A base material of the terminal is copper or copper alloy, the contact portion is provided with a contact coating film made of metal selected from Au, Sn, solder and the like, the portion to be connected to the circuit board is provided with a metallic coating film constituting a soldering portion including Sn or solder, and these metallic coating films are often formed with an undercoat metallic film including Cu or Ni interposed therebelow as a barrier layer which prevents diffusion of the material into the base material. Referring to FIG. 6 of Japanese Unexamined Patent Publication No. 05-82201 illustrating the terminal, a metallic undercoat is formed between the contact portion and the portion to be connected to the circuit board.

Japanese Patent No. 3926355 discloses an electrically conductive material for connecting parts having high electrical reliability (low contact resistance) and a small coefficient of friction, which is suitably used as a matable connector terminal. According to the invention disclosed in Japanese Patent No. 3926355, a copper alloy strip having a larger surface roughness than conventional copper alloy strips is used as a base material, an Ni plating layer, a Cu plating layer and a Sn plating layer, or a Cu plating layer and a Sn plating layer are formed on the surface of the base material in the mentioned order, or a Sn plating layer alone is formed on the surface, and the Sn plating layer is subjected to the reflow treatment so that a Cu—Sn alloy layer is formed from the Cu plating layer and the Sn plating layer, or the copper alloy base material and the Sn plating layer, and a part of the Cu—Sn alloy layer is exposed on the surface through the Sn plating layer smoothened by the reflow treatment (a part of the Cu—Sn alloy layer is exposed on the surface of the base material through protrusions of an irregularity portion formed thereon).

The electrically conductive material for connecting parts formed after the reflow treatment, which is disclosed in Japanese Patent No. 3926355, has a surface coating layer including a Cu—Sn alloy layer and a Sn layer, or an Ni layer, a Cu—Sn alloy layer and a Sn layer in the mentioned order, and a Cu layer possibly remains between the surface of the base material and the Cu—Sn alloy layer or between the Ni layer and the Cu—Sn alloy layer. It is defined in Japanese Patent No. 3926355 that the Cu—Sn alloy layer and the Sn layer are formed as an outermost surface (area ratio of the Cu—Sn alloy layer exposed on the surface is 3 to 75%), the Cu—Sn alloy layer has an average thickness of 0.1 to 3.0 μm, a contained amount of Cu is 20 to 70 at %, and the Sn layer has an average thickness of 0.2 to 5.0 μm. It is further disclosed in Japanese Patent No. 3926355 that an arithmetic mean roughness Ra of the base material surface in at least one direction is desirably at least 0.15 μm, the arithmetic mean roughness Ra thereof in all of directions is desirably at most 4.0 μm, and the Cu—Sn alloy layer is desirably exposed on the surface at intervals of 0.01 to 0.5 mm in at least one direction.

Japanese Patent No. 4024244 discloses an electrically conductive material for connecting parts equivalent to a subordinate concept of Japanese Patent No. 3926355, and a manufacturing method thereof, wherein a plating layer and a post-reflow coating layer itself are configured equally to those disclosed in Japanese Patent No. 3926355. In the electrically conductive material for connecting parts formed after the reflow treatment which is disclosed in Japanese Patent No. 4024244, a Cu—Sn alloy layer and a Sn layer are formed as an outermost surface (Cu—Sn alloy layer of the surface coating layer has an exposure area ratio from 3 to 75%), wherein it is defined that the Cu—Sn alloy layer has an average thickness of 0.2 to 3.0 μm, a contained amount of Cu is 20 to 70 at %, the Sn layer has an average thickness of 0.2 to 5.0 μm, an arithmetic mean roughness Ra of the material surface in at least one direction is at least 0.15 μm, and the arithmetic mean roughness Ra thereof in all of directions is at most 3.0 μm. It is further disclosed in Japanese Patent No. 4024244 that an arithmetic mean roughness Ra of the base material surface in at least one direction is desirably at least 0.3 μm, the arithmetic mean roughness Ra thereof in all of directions is desirably at most 4.0 μm, and the Cu—Sn alloy layer is desirably exposed on the surface at an interval of 0.01 to 0.5 mm in at least one direction.

Japanese Unexamined Patent Publication No. 2007-258156 discloses an electrically conductive material for connecting parts which achieves better solderability while essentially succeeding the technical ideas of Japanese Patent Nos. 3926355 and 4024244, and a manufacturing method thereof. Although a plating layer and a post-reflow coating layer itself according to the invention disclosed in this document are basically configured equally to those disclosed in Japanese Patent Nos. 3926355 and 4024244, a Cu—Sn alloy layer according to the invention may not be exposed (outermost surface may include Sn layer alone), which is different from Japanese Patent Nos. 3926355 and 4024244. In the electrically conductive material for connecting parts formed after the reflow treatment which is described in the subject application, an Ni layer of the surface coating layer has an average thickness equal to or smaller than 3.0 μm, the Cu—Sn alloy layer of the surface coating layer has an average thickness of 0.2 to 3.0 μm, a minimum inscribed circle diameter "D1" of the Sn layer in a perpendicular cross section of the material is equal to or smaller than 0.2 μm, a maximum inscribed circle diameter "D2" thereof is equal to or smaller than 1.2 to 20 μm, and a height difference "Y" between an outermost point of the material and an outermost point of the Cu—Sn alloy layer is equal to or smaller than 0.2 μm. It is further disclosed that a maximum inscribed circle diameter "D3" of the Cu—Sn alloy layer on the material surface is desirably equal to or smaller than 150 μm and/or a maximum inscribed circle diameter "D4" of the Sn layer on the material surface is desirably equal to or smaller than 300 μm when "D1" is 0 μm (a part of the Cu—Sn alloy layer is exposed on a surface of the base material, and the outermost surface includes the Cu—Sn alloy layer and the Sn layer).

It is disclosed in Japanese Unexamined Patent Publication Nos. 2004-300524, 2005-105307, and 2005-183298 that when a copper alloy strip is subjected to die cutting work and then plated with Sn in whole, in other words, subjected to after-plating so that a Sn plating layer is formed on not only a rolled surface but also a die-cut end surface, a terminal thereby obtained can have better solderability than a terminal obtained by plating the copper alloy strip with Sn before the die cutting work (pre-plating).

Japanese Unexamined Patent Publication Nos. 2008-269999 and 2008-274364 disclose a terminal subjected to after-plating which achieves higher electric reliability (low contact resistance), a small coefficient of friction in the fitting portion, and a solderability improvement in the soldering portion.

According to the invention disclosed in Japanese Unexamined Patent Publication No. 2008-269999, the fitting portion alone has an increased surface roughness when the terminal is formed, an Ni plating layer, a Cu plating layer, and a Sn plating layer are formed in the mentioned order, or the Cu plating layer and the Sn plating layer are formed in the mentioned order, or the Sn plating layer alone is formed on the fitting portion, the Sn plating layer is subjected to the reflow treatment so that the Cu—Sn alloy layer is formed from the Cu plating layer and the Sn plating layer, or the copper alloy base material and the Sn plating layer, and a part of the Cu—Sn alloy layer is exposed on the surface of the base material through the Sn plating layer smoothened by the reflow treatment (a part of the Cu—Sn alloy layer is exposed on the base material surface through protrusions of an irregularity portion formed thereon). A plating thickness is equal on all of the surfaces. Although the fitting portion, where the Cu—Sn alloy layer and the Sn layer are formed as an outermost surface (Cu—Sn alloy layer is exposed on the surface), may have a problem in its solderability, portions having no irregularity other than the fitting portion where the Cu—Sn alloy layer is not exposed (outermost surface is Sn layer alone) have favorable solderability.

According to the invention disclosed in Japanese Unexamined Patent Publication No. 2008-274364, die cutting work is performed to a copper alloy material having a large surface roughness to obtain a terminal material, an Ni plating layer, a Cu plating layer and a Sn plating layer are formed in the mentioned order, or the Cu plating layer and the Sn plating layer are formed in the mentioned order, or the Sn plating layer alone is formed, the Sn plating layer is subjected to the reflow treatment so that the Cu—Sn alloy layer is formed from the Cu plating layer and the Sn plating layer, or the copper alloy base material and the Sn plating layer, and a part of the Cu—Sn alloy layer is exposed on a surface of the base material through the Sn plating layer smoothened by the reflow treatment (a part of the Cu—Sn alloy layer is exposed on the base material surface through protrusions of an irregularity portion formed thereon). The Sn plating layer of the soldering portion is formed in a large thickness so that the Cn—Sn alloy layer is not exposed on the surface in the soldering portion. Therefore, the soldering portion can ensure favorable solderability.

The fitting portion of the PCB terminal disclosed in International Publication WO2008-072418, where the hard Cu—Sn alloy layer is present below Sn of the surface layer, essentially has a smaller coefficient of friction than conventional post-reflow Sn-plated material. The reduction of the coefficient of friction in the PCB terminal, however, is not as effective as in the terminals produced from the materials of Japanese Patent Nos. 3926355 and 4024244 or the terminals disclosed in Japanese Unexamined Patent Publication Nos. 2008-269999 and 2008-274364.

The electrical conductive materials for connecting parts disclosed in Japanese Patent Nos. 3926355 and 4024244, and Japanese Unexamined Patent Publication Nos. 2007-258156, 2008-269999, and 2008-274364 are characterized in that the surface-roughened copper plate is used as the base material, the Ni plating layer, Cu plating layer and Sn plating layer, for example, are formed in the mentioned order on the surface of the base material, the Sn plating layer is subjected to the reflow treatment, the Cu—Sn alloy coating layer is formed from the Cu plating layer and the Sn plating layer, and a part of the Cu—Sn alloy coating layer is exposed on the surface through the Sn coating layer smoothened by the reflow treatment.

Conventionally, there are parameters representing exposure statuses of the Sn coating layer and the Cu—Sn coating layer, which are: the exposure area ratio and the average exposure intervals of the Cu—Sn alloy coating layer (Japanese Patent Nos. 3926355 and 4024244), and the maximum inscribed circle diameter and the maximum circumscribed circle diameter of the Sn coating layer (Japanese Unexamined Patent Publication No. 2007-258156).

However, no notice has been taken so far for shapes of the Sn coating layer and the Cu—Sn alloy coating layer. To meet the demand for further downsizing of the terminal, it is recommended to start addressing specific shapes of the Sn coating layer and the Cu—Sn alloy coating layer rather than simply relying on the relatively unspecific parameters conventionally available, because it will soon be necessary to provide these layers with a planar shape which is suitably controllable and easy to form.

Therefore, the present invention provides a PCB terminal provided with a Sn coating layer and a Cu—Sn alloy coating layer having a suitably controllable planar shape in the fitting portion, and having a small coefficient of friction and remarkable electrical reliability (low contact resistance value after prolonged heating) that can meet the demand for further downsizing.

SUMMARY OF THE INVENTION

A PCB terminal according to the present invention is manufactured by die-cutting a copper plate (meaning cupper plate or cupper alloy plate hereinafter) into a predetermined shape and then subjecting the resulting copper plate to a tin plating (meaning tin plating or tin alloy plating hereinafter) and a reflow treatment, the PCB terminal including: a fitting portion formed on one end to be inserted in a counterpart terminal; a soldering portion formed on the other end to be soldered to a circuit board; and an intermediate portion formed between the fitting portion and the soldering portion, wherein a Cu—Sn alloy coating layer and a Sn coating layer are formed as a surface coating layer on the fitting portion in this order, the Sn coating layer is smoothened by the reflow treatment, a part of the Cu—Sn alloy coating layer is exposed on an outermost surface, the Cu—Sn alloy coating layer has an average thickness of 0.1 to 3 μm, and the Sn coating layer has an average thickness of 0.2 to 5.0 μm, the PCB terminal being further characterized in that:

(1) the Sn coating layer includes a group of Sn coating layers having a width of 1 to 500 μm that are a plurality of essentially parallel lines, the Cu—Sn alloy coating layers are adjacently formed on both sides of the Sn coating layers each constituting the group of Sn coating layers, the adjacent Sn coating layers included in the group of Sn coating layers have an interval of 1 to 2000 μm therebetween, and a maximum height roughness Rz in a terminal insertion direction is at most 10 μm;

(2) the Sn coating layer includes a first group of Sn coating layers having a width of 1 to 500 μm that are a plurality of essentially parallel lines and further includes, apart from the first group of Sn coating layers, one or at least two second groups of Sn coating layers having a width of 1 to 500 μm that are a plurality of essentially parallel lines, the first and second groups of Sn coating layers intersect with each other in a grid pattern, the Cu—Sn alloy coating layers are adjacently formed on both sides of the Sn coating layers each constituting the respective groups of Sn coating layers, the adjacent Sn coating layers included in the same group of Sn coating layers have an interval of 1 to 2000 μm therebetween, and a maximum height roughness Rz in the terminal insertion direction is at most 10 μm; or (3) the Sn coating layer includes a group of Sn coating layers having an equivalent circle diameter of 5 to 1000 μm that are a plurality of shapes each formed by a closed contour, the Cu—Sn coating layer is formed around the Sn coating layers each constituting the group of Sn coating layers so as to surround the Sn coating layers, most proximate Sn coating layers included in the group of Sn coating layers have an interval of 1 to 2000 μm therebetween, and a maximum height roughness Rz in the terminal insertion direction is at most 10 μm.

The surface coating layers recited in (1) to (3) can be formed on a copper plate having a roughened surface in a portion corresponding to the fitting portion. The surface roughening treatment is desirably performed through press working to a rolled surface of the copper plate before tin-plating. In (1) and (2), recesses that are as a plurality of essentially concaved parallel lines are formed on the surface. In (3), recesses that are a plurality of concave shapes each formed by a closed contour are formed on the surface.

The Sn coating layers constituting the respective groups of Sn coating layers in (1) and (2) are a plurality of essentially parallel lines, however, these Sn coating layers do not necessarily represent mathematically parallel lines. The present invention includes a mode wherein the Sn coating layers constituting the respective groups of Sn coating layers having a substantially equal shape are curved, corrugated, or bent.

In (3), the shape having a closed contour includes variously different geometrical shapes, for example, tetragons such as square, rectangle, rhombus, parallelogram, and trapezoid, polygons such as triangle and hexagon, and other shapes such as circle, ellipse, and race track shape. The plurality of shapes may include one of the shapes periodically repeated or a combination of at least two of the shapes.

The surface coating layer of the fitting portion of the PCB terminal has the Cu—Sn alloy coating layer and the Sn coating layer formed in this order as an outermost surface, and a part of the Cu—Sn alloy coating layer is exposed on the outermost surface through the Sn coating layer smoothened by the reflow treatment. The surface coating layer is configured equally to those described in Japanese Patent Nos. 3926355 and 4024244, and Japanese Unexamined Patent Publication No. 2007-258156. The Cu—Sn alloy coating layer thus exposed on the outermost surface is measured as ridge portions of a roughness curve, and the ridge portions are reflected on the value of the maximum height roughness Rz.

The Cu—Sn alloy coating layer has an average thickness of 0.1 to 3 μm, and the Sn coating layer has an average thickness of 0.2 to 5.0 μm. Thus, the average thicknesses of the respective coating layers are equal to the numeral values disclosed in Japanese Patent Nos. 3926355 and 4024244, and Japanese Unexamined Patent Publication No. 2007-258156.

In the PCB terminal, the surface coating layer thus characterized is preferably formed on at least one of the rolled surfaces of the copper plate (surfaces other than the die-cut end surface), and the surface mostly serves as a contact surface making contact (slidable contact) with the counterpart terminal. On a surface where the surface coating layer is not formed, the Cu—Sn alloy coating layer and the Sn coating layer are formed in this order, and the Sn coating layer smoothened by the reflow treatment generally covers the entire outermost surface.

It is desirable that an Ni coating layer be formed between the surface of the copper plate (base material) and the Cu—Sn alloy coating layer as a part of the surface coating layer of the fitting portion in the PCB terminal. A Cu coating layer may be further formed between the Ni coating layer and the Cu—Sn alloy coating layer, and a CU coating layer may be further formed between the surface of the copper plate and the Ni-coating layer. When the Ni coating layer is provided, a part or the whole of the Cu—Sn alloy layer may result in a Cu—Ni—Sn alloy layer depending on heat treatment conditions during the reflow.

It is noted that according to the present invention, the Sn coating layer, Ni coating layer and the Cu coating layer respectively include Sn alloy and Cu alloy in addition to Sn, Ni, and Cu metal.

The PCB terminal has the soldering portion and the intermediate portion other than the fitting portion.

In the soldering portion, a Sn coating layer having an average thickness of 0.2 to 10 μm is preferably formed as a surface coating layer. A Cu—Sn alloy coating layer or an Ni—Sn alloy coating layer may be formed between the surface of the copper plate and the Sn coating layer as a part of the surface coating layer, and an Ni coating layer may be formed between the surface of the copper plate and the Cu—Sn alloy coating layer or the Ni—Sn alloy coating layer. A Cu coating layer may be formed between the Ni coating layer and the Cu—Sn alloy coating layer, and/or the Cu coating layer may be formed between the copper plate and the Ni coating layer.

Although it is not particularly required to perform the reflow treatment to the Sn coating layer of the soldering portion, the Sn coating layer is preferably subjected to the reflow treatment to have better solderability. At this time, the Cu—Sn alloy coating layer or the Ni—Sn alloy coating layer is formed with time in a case that the reflow treatment is omitted, but is formed by heat during the reflow treatment in a case that the reflow treatment is performed.

A surface coating layer, which is exactly the same as that of the fitting portion, may be formed on the soldering portion. In this case, the copper plate is preferably surface-roughened and plated together with the fitting portion.

If necessary, a non-reflow Sn plating layer may be formed on the post-reflow surface coating layer. In this case, an average thickness with the post-reflow Sn coating layer and the Sn plating layer in total is 0.2 to 10 μm. By providing the non-reflow Sn plating layer, the Cu—Sn alloy layer exposed on the surface is coated with Sn, which further improves the solderability.

The intermediate portion is not necessarily provided with a surface coating layer (bare portion), or may be provided with a surface coating layer including any of a Sn coating layer, an Ni coating layer, a Cu coating layer and a Cu—Sn alloy coating layer.

Alternatively, the intermediate portion may be provided with a surface coating layer which is exactly the same as that of the fitting portion, in which case the copper plate is preferably surface-roughened and plated together with the fitting portion.

The PCB terminal described above can be produced in the following manner; the copper plate is die-cut, a surface of the copper plate is subjected to press working to roughen the surface so that a plurality of recesses are formed thereon at the same time or before or after the die cutting, and the copper plate having the roughened surface is subjected to the tin-plating and then reflow treatment. When the non-reflow Sn coating layer is formed on the soldering portion, the soldering portion is plated with Sn after the reflow treatment.

The present invention can provide a PCB terminal provided with a fitting portion characterized by a low insertion force and remarkable electrical reliability.

The planar shapes of the Sn coating layer and the Cu—Sn alloy coating layer defined by the present invention are applicable to further downsized PCB terminals. When the copper plate is suitably surface-roughened, the planer shapes of the Sn coating layer and the Cu—Sn alloy coating layer can be easily controlled.

DETAILED DESCRIPTION OF PREFERRED EMBODIMENTS

Figure 1:
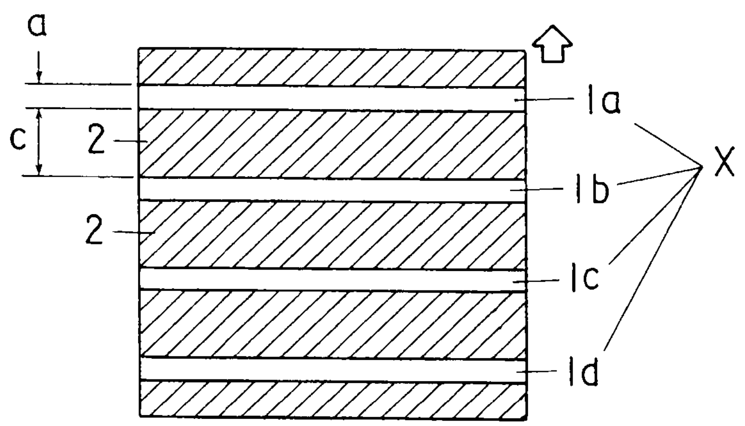
FIGS. 1A and 1B are schematic plan views illustrating an embodiment of a surface coating layer in a matable connecting part according to the present invention.
Figure 1:
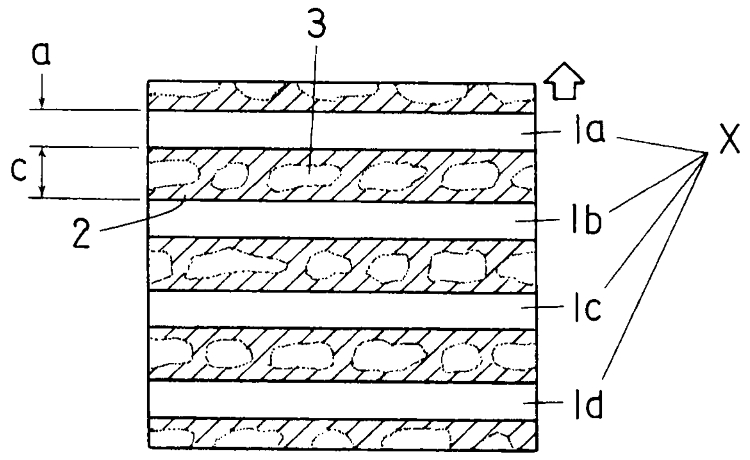
Figure 2:
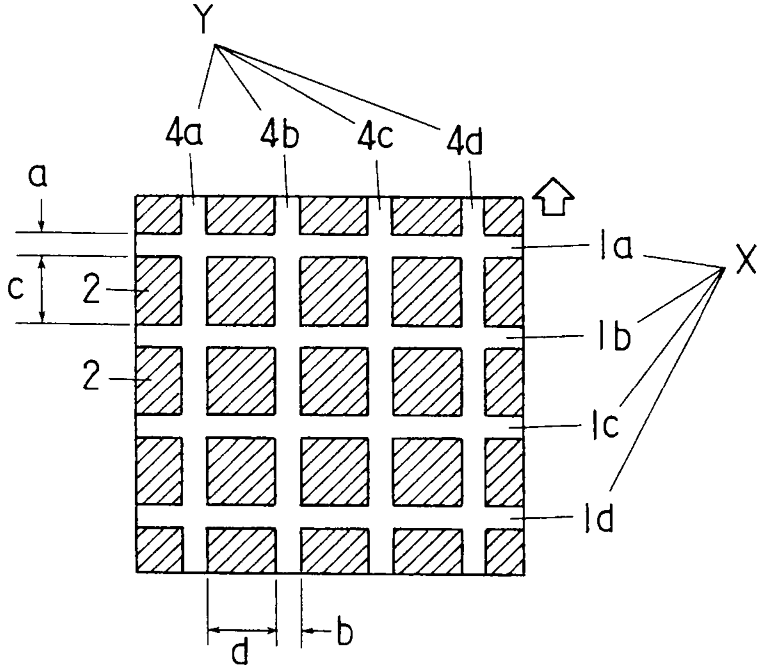
FIGS. 2A and 2B are schematic plan views illustrating another embodiment of the surface coating layer in the matable connecting part according to the present invention.
Figure 2:
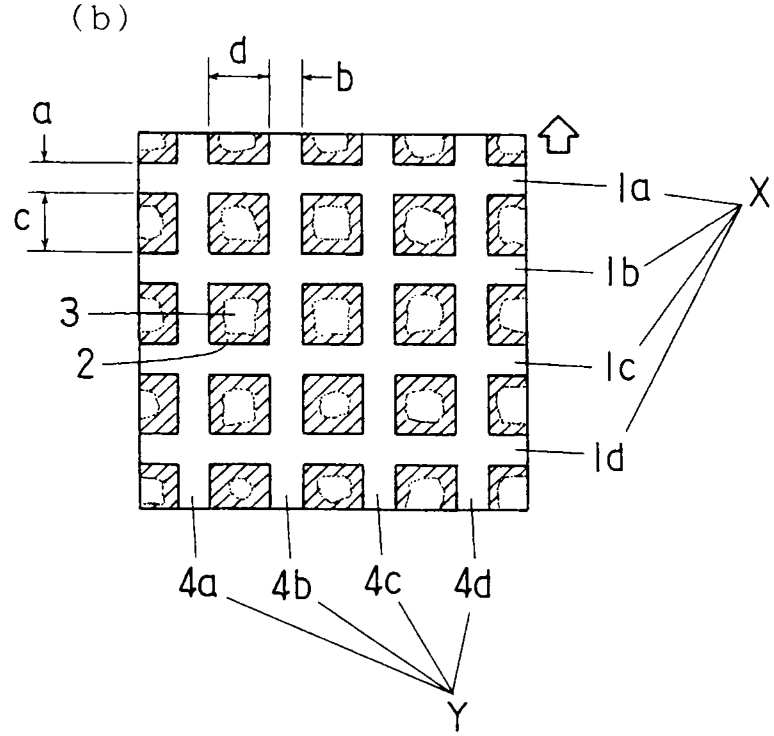

Hereinafter, a PCB terminal according to the present invention is described in detail.

The PCB terminal according to the present invention is produced by die-cutting a copper plate (copper alloy plate) into a predetermined shape and subjecting the resulting copper plate to after-plating with tin or tin alloy and a reflow treatment. The PCB terminal consists of a fitting portion formed on one end to be inserted in a counterpart terminal, a soldering portion formed on the other end to be soldered to a circuit board, and an intermediate portion formed between the fitting portion and soldering portion.

(Fitting Portion of PCB Terminal)

A Cu—Sn alloy coating layer and a Sn coating layer are formed in this order on the fitting portion of the PCB terminal as surface coating layers, the Sn coating layer is smoothened by the reflow treatment, and a part of the Cu—Sn alloy coating layer is exposed on the outermost surface through the Sn coating layer. When the hard Cu—Sn alloy coating layer is thus exposed on the outermost surface on the side of the fitting portion which makes contact (sliding contact) with the counterpart terminal, a coefficient of friction and a terminal insertion force are both reduced. The outermost Cu—Sn alloy coating layer thus exposed is measured as ridge portions of a roughness curve based on JIS B 0601, and the ridge portions are reflected on the value of a maximum height roughness Rz.

The Sn coating layer and the Cu—Sn alloy coating layer present in the fitting portion of the PCB terminal according to the present invention (surface which mostly makes contact (slidably contact) with the counterpart terminal) are formed in any of the following modes (1) to (3):

(1) the Sn coating layer includes a group of Sn coating layers that can be a plurality of essentially parallel lines, and the Cu—Sn alloy coating layers are adjacently provided on both sides of the Sn coating layers each constituting the group of Sn coating layers (such a Sn coating layer may be hereinafter called a parallel Sn coating layer);

(2) the Sn coating layer includes a group of Sn coating layers that can be a plurality of essentially parallel lines and further includes one or at least two groups of Sn coating layers that can be a plurality of essentially parallel lines, the groups of Sn coating layers intersect with each other in a grid pattern, and the Cu—Sn alloy coating layers are adjacently provided on both sides of the Sn coating layers (parallel Sn coating layers) each constituting the respective groups of Sn coating layers; or (3) the Sn coating layer includes a group of Sn coating layers that can be a plurality of shapes each formed by a closed contour, and the Cu—Sn coating layer is present around the Sn coating layers each constituting the group of Sn coating layer (such a Sn coating layer may be hereinafter called a shape-forming Sn coating layer).

First, the modes (1) and (2) of the parallel Sn coating layer and the Cu—Sn alloy coating layer are described with reference to schematic views of FIGS. 1A, 1B, 2A, and 2B. FIGS. 1A, 1B, 2A, and 2B are schematic plan views illustrating a part of the outermost surface of the fitting portion of the PCB terminal extracted in a substantially square shape.

Firstly, FIGS. 1A and 1B illustrate typical examples of the mode (1). In the example of FIG. 1A, a plurality of parallel Sn coating layers 1*a* to 1*d* having a predetermined width (hereinafter, may be collectively called a parallel Sn coating layer 1) are provided in the form of essentially parallel lines at substantially equal intervals, and Cu—Sn alloy coating layers 2 are adjacently provided on both sides of each of the parallel Sn coating layers 1*a* to 1*d*. The Cu—Sn alloy coating layers 2 also have a predetermined width and are provided in the form of essentially parallel lines at substantially equal intervals. The plurality of parallel Sn coating layers 1*a* to 1*d* provided in the form of essentially parallel lines constitute a group of Sn coating layers X according to the present invention.

In the example of FIG. 1B, a plurality of parallel Sn coating layers 1*a* to 1*d* having a predetermined width are provided in the form of essentially parallel lines at substantially equal intervals, and Cu—Sn alloy coating layers 2 are adjacently provided on both sides of each of the parallel Sn coating layers 1*a* to 1*d*. The Cu—Sn alloy coating layers 2 also have a predetermined width and are provided in the form of essentially parallel lines at substantially equal intervals. However, the example of FIG. 1B is different from the example of FIG. 1A in that a Sn coating layer 3 is present in the Cu—Sn alloy coating layer 2 in an island structure. The plurality of parallel Sn coating layers 1 provided in the form of essentially parallel lines constitute the group of Sn coating layers X according to the present invention.

The Sn coating layer 3 having an island structure in FIG. 1B can be variously formed. For example, the Sn coating layer 3 may be continuous to sectionalize the Cu—Sn alloy coating layer 2, or the Cu—Sn alloy coating layer may be further present in the Sn coating layer 3 in a smaller island structure.

FIGS. 2A and 2B illustrate typical examples of the mode (2). In the example of FIG. 2A, a plurality of parallel Sn coating layers 1*a* to 1*d* having a predetermined width are provided in the form of essentially parallel lines at substantially equal intervals, and a plurality of parallel Sn coating layers 4*a* to 4*d* having a predetermined width (hereinafter, may be collectively called a parallel Sn coating layer 4) are provided in the form of essentially parallel lines at substantially equal intervals so as to perpendicularly intersect with the plurality of parallel Sn coating layers 1*a* to 1*d*. The plurality of parallel Sn coating layers 1*a* to 1*d* provided in the form of essentially parallel lines constitute the group of Sn coating layers X according to the present invention, and the plurality of parallel Sn coating layers 4*a* to 4*d* also provided in the form of essentially parallel lines constitute a group of Sn coating layers Y according to the present invention. The two groups of Sn coating layers X and Y intersect with each other in a grid pattern, and the Cu—Sn alloy coating layer 2 is present in areas encompassed by the grids. In this case as well, it can be said that the Cu—Sn alloy coating layers 2 are adjacently provided on both sides of each of the parallel Sn coating layers 1 and 4.

In the example of FIG. 2A, a plurality of parallel Sn coating layers 1*a* to 1*d* having a predetermined width are provided in the form of essentially parallel lines at substantially equal intervals, and a plurality of parallel Sn coating layers 4*a* to 4*d* having a predetermined width are provided in the form of essentially parallel lines at substantially equal intervals so as to perpendicularly intersect with the plurality of parallel Sn coating layers 1*a* to 1*d*. The plurality of parallel Sn coating layers 1*a* to 1*d* provided in the form of essentially parallel lines constitute the group of Sn coating layers X according to the present invention, and the plurality of parallel Sn coating layers 4*a* to 4*d* also provided in the form of essentially parallel lines constitute the group of Sn coating layers Y according to the present invention. The two groups of Sn coating layers X and Y intersect with each other in a grid pattern, and the Cu—Sn alloy coating layer 2 is present in areas encompassed by the grids. In this example, a Sn coating layer 3 is present in the Cu—Sn alloy coating layer 2 in an island structure, which is different from the example of FIG. 2A. In this case as well, it can be said that the Cu—Sn alloy coating layers 2 are adjacently provided on both sides of each of the parallel Sn coating layers 1 and 4.

There may be various other modes of Sn coating layer 3 having an island structure in FIG. 2B, for example, the Cu—Sn alloy coating layer may be further present in the Sn coating layer 3 in a smaller island structure.

Figure 3:
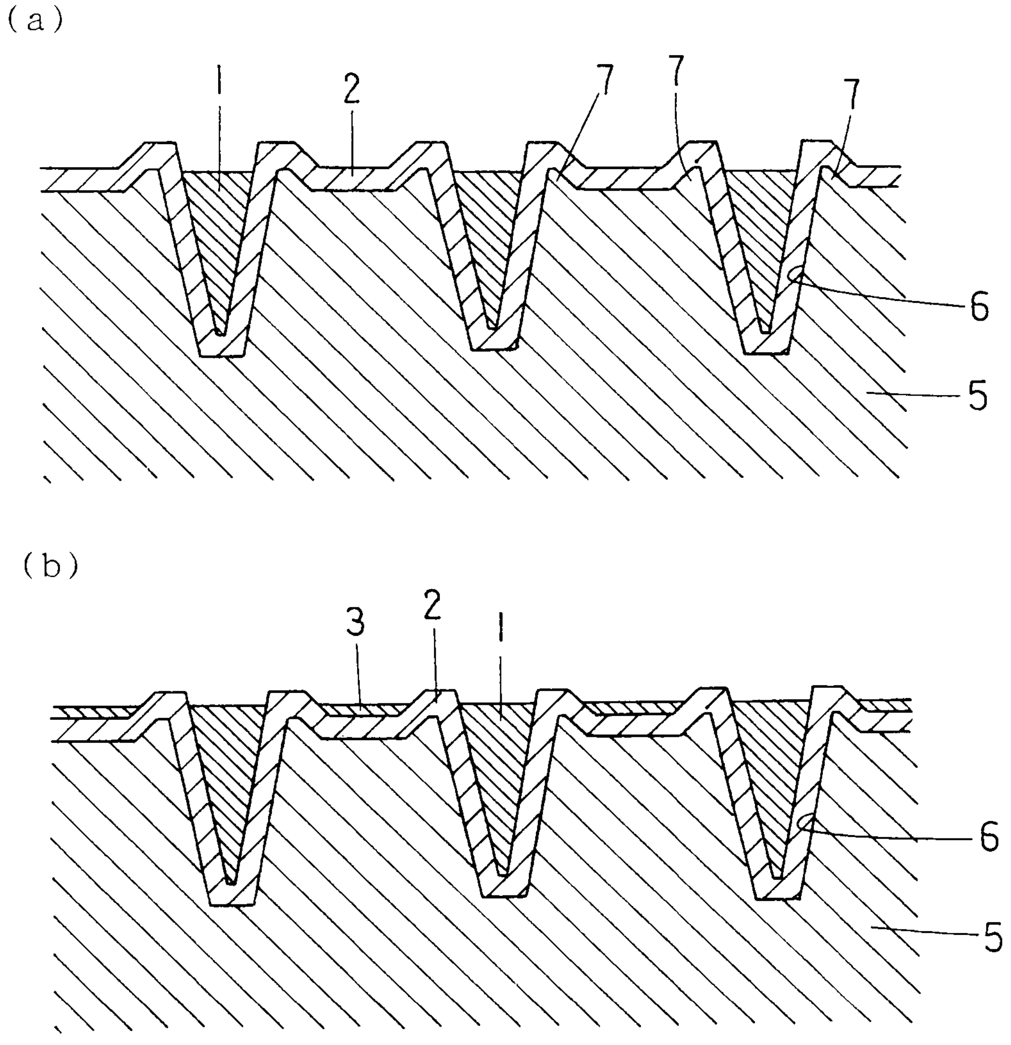
FIGS. 3A and 3B are schematic sectional views illustrating the surface coating layers of the embodiments in FIGS. 1A, 1B, 2A, and 2B.

In the fitting portions of the PCB terminal illustrated in FIGS. 1A, 1B, 2A, and 2B, the Cu—Sn alloy coating layer 2 exposed on the surface protrudes in a height direction from the level of the parallel Sn coating layer 1 (and the Sn coating layer 3 and the parallel Sn coating layer 4) smoothened by the reflow treatment. Such a sectional characteristic of the two coating layers will be described with reference to schematic sectional views of FIGS. 3A and 3B.

In a copper plate 5 (base material) 5 illustrated in FIGS. 3A and 3B, relatively deep recesses 6 are formed at substantially equal intervals, protrusions 7 are formed on both sides of the recesses 6, and the protrusions 7 and 7 adjacent to each other with no recess 6 therebetween are relatively flat. Such a surface structure is called a plateau structure. The recesses 6 are a plurality of essentially parallel lines on the surface of the copper plate 5.

FIG. 3A corresponds to FIG. 1A (or FIG. 2A), wherein the Cu—Sn alloy coating layer 2 is formed on the entire surface of the copper plate 5, and the parallel Sn coating layer 1 is formed on the Cu—Sn alloy coating layer 2 in the recesses 6. The parallel Sn coating layer 1 thus formed in the recesses 6 represents the parallel Sn coating layers 1*a* to 1*d* (or parallel Sn coating layers 4*a* to 4*d*) being as essentially parallel lines in FIG. 1A or FIG. 2A.

FIG. 3B corresponds to FIG. 1B (or FIG. 2B), wherein the Cu—Sn alloy coating layer 2 is formed on the entire surface of the copper plate 5, and the parallel Sn coating layer 1 is formed on the Cu—Sn alloy coating layer 2 in the recesses 6. The Sn coating layer 3 is formed on the Cu—Sn alloy coating layer 2 in the plateau-like sections. The parallel Sn coating layer 1 thus formed in the recesses 6 represents the parallel Sn coating layers 1*a* to 1*d* (or parallel Sn coating layers 4*a* to 4*d*) being as essentially parallel lines in FIG. 1A or FIG. 2A. The Sn coating layer 3 formed on the plateau-like sections represents the Sn coating layer 3 seen in island shape in FIG. 1B or FIG. 2B.

A method for forming the surface coating layer including the Cu—Sn alloy coating layer 2 and the parallel Sn coating layer 1 (and parallel Sn coating layer 4) will be described in detail below.

Figure 4:
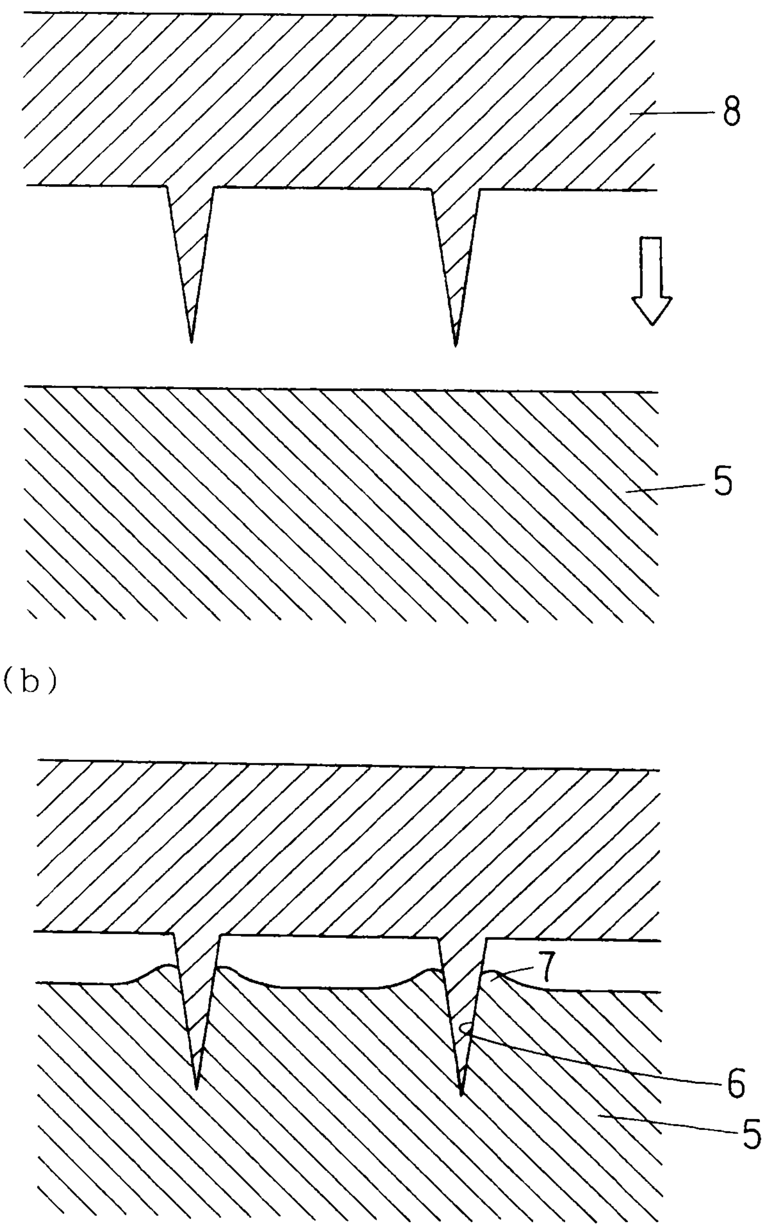
FIGS. 4A and 4B are schematic sectional views illustrating a surface roughening treatment of a copper plate for obtaining the surface coating layers of the embodiments in FIGS. 1A, 1B, 2A, and 2B.

The copper plate 5 is die-cut into the shape of the PCB terminal, and at least a rolled surface (one or both surfaces) of a portion that will be used as the fitting portion is subjected to press working so that the surface is roughened alongside, after, or before the die cutting. More specifically describing the surface roughening treatment, as illustrated in FIG. 4A, a die 8 having a pressing surface where fine protrusions and recesses are formed at substantially constant pitches is set in a pressing machine, and the surface of the copper plate 5 is pressed by the die 8. By the press working, the protrusions (tips of teeth) formed on the pressing surface of the die 8 are pushed into the surface of the copper plate 5, and the recesses 6 are transferred to the surface of the copper plate 5 in the form of essentially parallel lines. At the same time, the protrusions 7 are automatically formed from the material pushed out from the recesses 6 and mounded on both sides of the recesses 6. The protrusions 7 and 7 adjacent to each other with no recess 6 therebetween retain a relatively flat (plateau-like) shape immediately after finish rolling.

Similarly to Japanese Patent Nos. 3926355 and 4024244, and Japanese Unexamined Patent Publication No. 2007-258156, the entire surface (rolled surface and die-cut end surface) of the copper plate 5 die-cut into the shape of the PCB terminal is plated with Cu and Sn and then subjected to the reflow treatment. As a result of the reflow treatment, the Cu—Sn alloy coating layer is formed from Cu of the Cu plating layer and Sn of the Sn plating layer, and the melted Sn flows into the recesses of the surface of the copper plate 5. At the surface-roughened portion of the copper plate, the melted Sn flows into the recesses 6 of the copper plate 5, and the smoothened parallel Sn coating layer 1 is formed on the Cu—Sn alloy coating layer 2 as illustrated in FIG. 3A. Then, a part of the Cu—Sn alloy coating layer 2 is exposed adjacent to the parallel Sn coating layer 1 on both sides thereof. At this time, a part of the Cu plating layer may remain below the Cu—Sn alloy coating layer 2.

It is noted that in the present invention, each of the layers constituting a surface coating layer after the reflow treatment is called "coating layer", and each of the layers constituting a surface plating layer before the reflow treatment is called "plating layer".

With a relatively large amount of Sn remaining after the reflow treatment, the Sn coating layer 3 is formed on the plateau-like sections on the surface-roughened portion of the copper plate (see FIG. 1B, FIG. 2B, and FIG. 3B), or an overall coating area of the Sn coating layer 3 increases. As illustrated in FIG. 3B, the Sn coating layer 3 has a smaller thickness than the parallel Sn coating layer 1.

The parallel Sn coating layers 1 constituting the group of Sn coating layers X and the parallel Sn coating layers 4 constituting the group of Sn coating layers Y all have widths a and b (see FIGS. 1A, 1B, 2A, and 2B) of 1 to 500 μm, and intervals c and d (see FIGS. 1A, 1B, 2A, and 2B) between the adjacent parallel Sn coating layers are set in the range of 1 to 2000 μm. The widths of the parallel Sn coating layers and the intervals between the adjacent parallel Sn coating layers are thus set because these numerical ranges allow the parallel Sn coating layers and the Cu—Sn alloy coating layer to be suitably exposed together on the outermost surface. This ensures remarkable electrical reliability, and also ensures a lower coefficient of friction, thereby requiring a less insertion force.

More specifically describing, the widths of the parallel Sn coating layers are set to at least 1 μm because formation of the parallel Sn coating layer having any width smaller than this value makes it difficult to roughen the surface of the copper plate. On the other hand, if the widths of the parallel Sn coating layers are too large, an unfavorable event may be invited such that a contact point of the counterpart terminal progresses into the parallel Sn coating layers, increasing the insertion force. Therefore, the widths of the parallel Sn coating layers are set to at most 500 μm. To meet the demand for further downsizing of the PCB terminal in recent years, the widths of the parallel Sn coating layers are desirably at most 200 μm, and more desirably at most 50 μm.

The intervals between the adjacent parallel Sn coating layers are set to at least 1 μm because any value smaller than this value makes it difficult to roughen the surface of the copper plate. On the other hand, the excessively large intervals between the adjacent parallel Sn coating layers generate the following event depending on the original thickness of the Sn plating layer. The Sn plating layer having a large average thickness lessens an exposure area of the Cu—Sn alloy layer while increasing that of the Sn layer in the portion between the Sn coating layers, and further excessively reduces a contact area between the counterpart terminal and the Cu—Sn alloy coating layer, causing an increase in the insertion force (insertion force reduction effect is lowered). The Sn plating layer having a small average thickness increases an area occupied by the Cu—Sn alloy layer (the whole area may be occupied by the Cu—Sn alloy layer). Although the coefficient of friction may be reduced, the contact resistance accordingly increases, thereby deteriorating the electrical reliability. Therefore, the interval between the parallel Sn coating layers is set to at most 2000 μm. To meet the demand for further downsizing of the PCB terminal in recent years, the widths of the parallel Sn coating layers are desirably at most 1000 μm, and more desirably at most 250 μm. It is desirable that the widths of the parallel Sn coating layers and the intervals between the adjacent parallel Sn coating layers be substantially constant, which, however, is not an indispensable requirement. The parallel Sn coating layers 1 and 4 are desirably distributed substantially evenly on the entire surface where they are formed (roughened surface). A terminal which allows a large current to flow therethrough has a large sectional area. Therefore, the contact point of the counterpart terminal (female terminal) inevitably increases, thereby increasing an area in contact with the fitting portion. Accordingly, larger intervals are acceptable between the adjacent parallel Sn coating layers, for example, at least 500 μm and at most 2000 μm. The widths of the parallel Sn coating layers and the intervals between the adjacent parallel Sn coating layers are preferably set to suitable ranges depending on the shape and size of the contact point of the counterpart terminal to be connected.

As illustrated in FIGS. 3A and 3B, the Cu—Sn alloy coating layer 2 exposed on the outermost surface protrudes in a height direction from the levels of the parallel Sn coating layer 1 and the Sn coating layer 3. For example, when the surface roughness is measured in the insertion direction of the PCB terminal (illustrated with white arrows in FIGS. 1A, 1B, 2A, and 2B), the surface roughness is measured as ridge portions of the roughness curve based on JIS B 0601.

The present invention defines that the maximum height roughness Rz in the insertion direction of the PCB terminal is at most 10 μm (including 0 μm). In the case where the maximum height roughness Rz is large, a surface area of the Cu—Sn alloy coating layer exposed on the outermost surface increases. As a result, the terminal surface has a poor corrosion resistance, generating more oxides, and the contact resistance is likely to increase, making it difficult to maintain the electrical reliability. In the case where the recesses 6 are formed in large depth and width when the copper plate 5 is surface-roughened, the maximum height roughness Rz increases. Such large and deep recesses 6 easily lead to deformation of the copper plate 5. Therefore, the maximum height roughness Rz is desirably at most 10 μm, and more desirably larger than 0 μm (slightly protruding) and at most 5 μm.

In the example of FIGS. 2A and 2B, two groups of Sn coating layers X and Y perpendicularly intersect with each other, however, an angle at which they intersect with each other can be arbitrarily set. When these two groups of Sn coating layers X and Y intersect with each other, corner portions of the Cu—Sn alloy coating layer are raised higher than other portions (in the surface roughening treatment, corner portions where two recesses intersect with each other are raised higher than other portions), improving the insertion force reducing effect. As far as the widths of the parallel Sn coating layers and the intervals between the parallel Sn coating layers remain unchanged, the corner portions are raised at larger intervals as the intersecting angle is smaller, thereby lowering the insertion force reducing effect. Therefore, the intersecting angle is desirably set in the range of 10 to 90 degrees.

According to the present invention, at least three groups of Sn coating layers may intersect with one another in a grid pattern. In this case, the parallel Sn coating layers constituting the respective groups of Sn coating layers have widths of 1 to 500 μm, and an interval between the adjacent parallel Sn coating layers included in the same group of Sn coating layers is set in the range of 1 to 2000 μm. Similarly, the intersecting angle of the respective groups of Sn coating layers is desirably set in the range of 10 to 90 degrees.

An angle formed by the insertion direction of the PCB terminal and the length direction of the group of Sn coating layers may be suitably set in the range of 0 to 90 degrees. When only one group of Sn coating layers is provided, the angle is desirably larger than 0 degree and at most 90 degrees. The angle is desirably larger, 20 to 90 degrees, and more desirably 90 degrees. When at least two groups of Sn coating layers are provided, at least one of the groups of Sn coating layers forms an angle in the foregoing range with the insertion direction.

Figure 5:
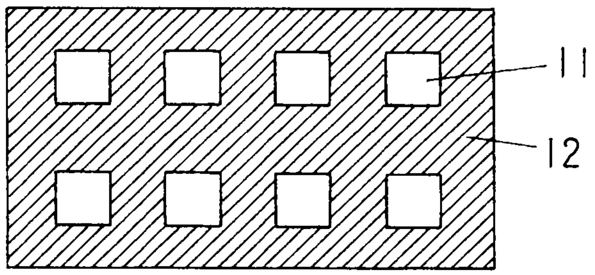
FIGS. 5A to 5C are schematic plan views illustrating still another embodiment of the surface coating layer in the matable connecting part according to the present invention.
Figure 5:
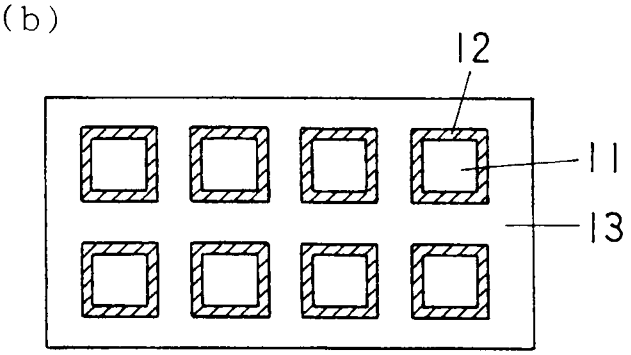
Figure 5:
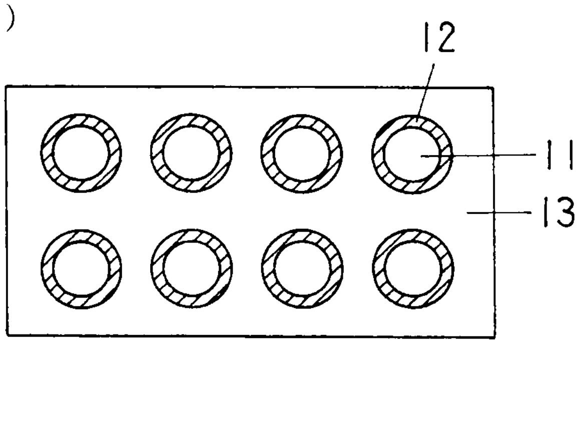

Next, the mode (3) of the Sn coating layer and the Cu—Sn alloy coating layer will be described with reference to schematic views of FIGS. 5A to 5C. FIGS. 5A to 5C are schematic plan views of a part of the outermost surface of the fitting portion of the PCB terminal extracted in a substantially rectangular shape.

In the example of FIG. 5A, a plurality of shape-forming Sn coating layers 11 being as shapes each formed by a substantially square contour are regularly formed in a grid pattern, and a Cu—Sn alloy coating layer 12 is provided so as to surround the peripheral portions of the shape-forming Sn coating layers 11.

In the example of FIG. 5B, a plurality of shape-forming Sn coating layers 11 are regularly formed in a grid pattern similarly to the above, a Cu—Sn alloy coating layer surrounds the peripheral portions of the respective shape-forming Sn coating layers 11 in a ring shape, and a Sn coating layer 13 is provided so as to fill the space therearound.

According to the present invention, these shape-forming Sn coating layers 11 are called a group of Sn coating layers.

In the fitting portions of the PCB terminal illustrated in FIGS. 5A and 5B, the Cu—Sn alloy coating layer 12 exposed on the surface protrude in the height direction from the level of the shape-forming Sn coating layer 11 (and the Sn coating layer 13) smoothened by the reflow treatment. Such a sectional characteristic of the two coating layers will be described with reference to schematic sectional views of FIGS. 6A and 6B.

Figure 6:
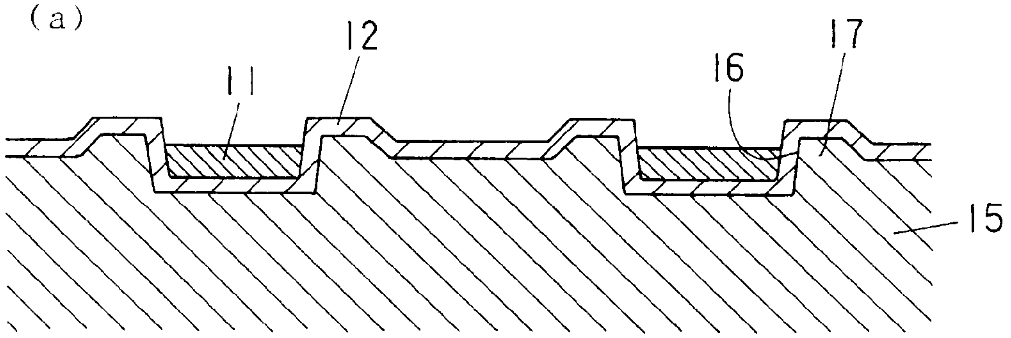
FIGS. 6A and 6B are schematic sectional views illustrating the surface coating layer of the embodiment in FIGS. 5A to 5C.
Figure 6:
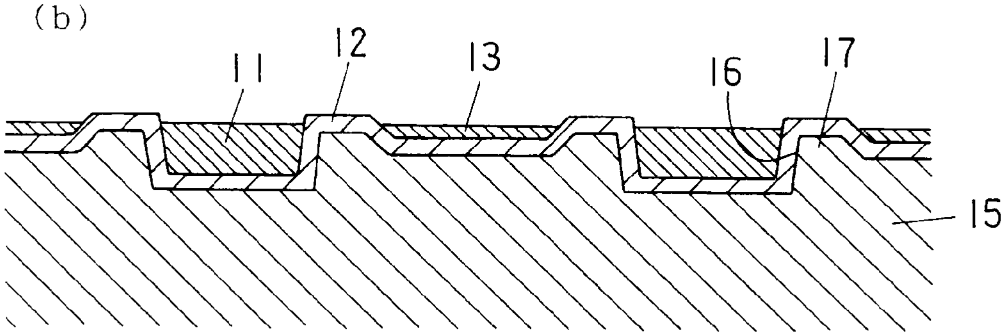

In FIGS. 6A and 6B, a copper plate (base material) 15 has relatively deep recesses 16 formed at substantially equal intervals, and protrusions 17 formed around the recesses 16, wherein peripheral portions of the protrusions 17 are relatively flat. Such a surface structure is called a plateau structure. The recesses 16 are shapes each formed by a plurality of substantially square contour on the surface of a copper plate 15.

FIG. 6A corresponds to FIG. 5A, wherein the Cu—Sn alloy coating layer 12 is formed on the entire surface of the copper plate 15, and the Sn coating layer 11 is formed on the Cu—Sn alloy coating layer 12 in the recesses 16. The Sn coating layer 11 thus formed in the recesses 16 represents the shape-forming Sn coating layers 11 being as shapes each formed by a substantially square contour in FIG. 5A.

FIG. 6B corresponds to FIG. 5B, wherein the Cu—Sn alloy coating layer 12 is formed on the entire surface of the copper plate 15, and the Sn coating layer 1 is formed on the Cu—Sn alloy coating layer 12 in the recesses 16. In the plateau-like sections, the Sn coating layer 13 is formed on the Cu—Sn alloy coating layer 12, and the Cu—Sn alloy coating layer 12 is exposed only on the protrusions 17. The Sn coating layer 11 thus formed in the recesses 16 represents the shape-forming Sn coating layers 11 being as shapes each formed by a substantially square contour in FIG. 5B. The Sn coating layer 13 formed on the plateau-like sections represents the Sn coating layer 13 filling the peripheral portion of the ring-shaped Cu—Sn alloy coating layer 12 in FIG. 5B.

A method for forming the surface coating layers illustrated in FIGS. 5A to 5C and FIGS. 6A and 6B will be described in detail below.

Figure 7:
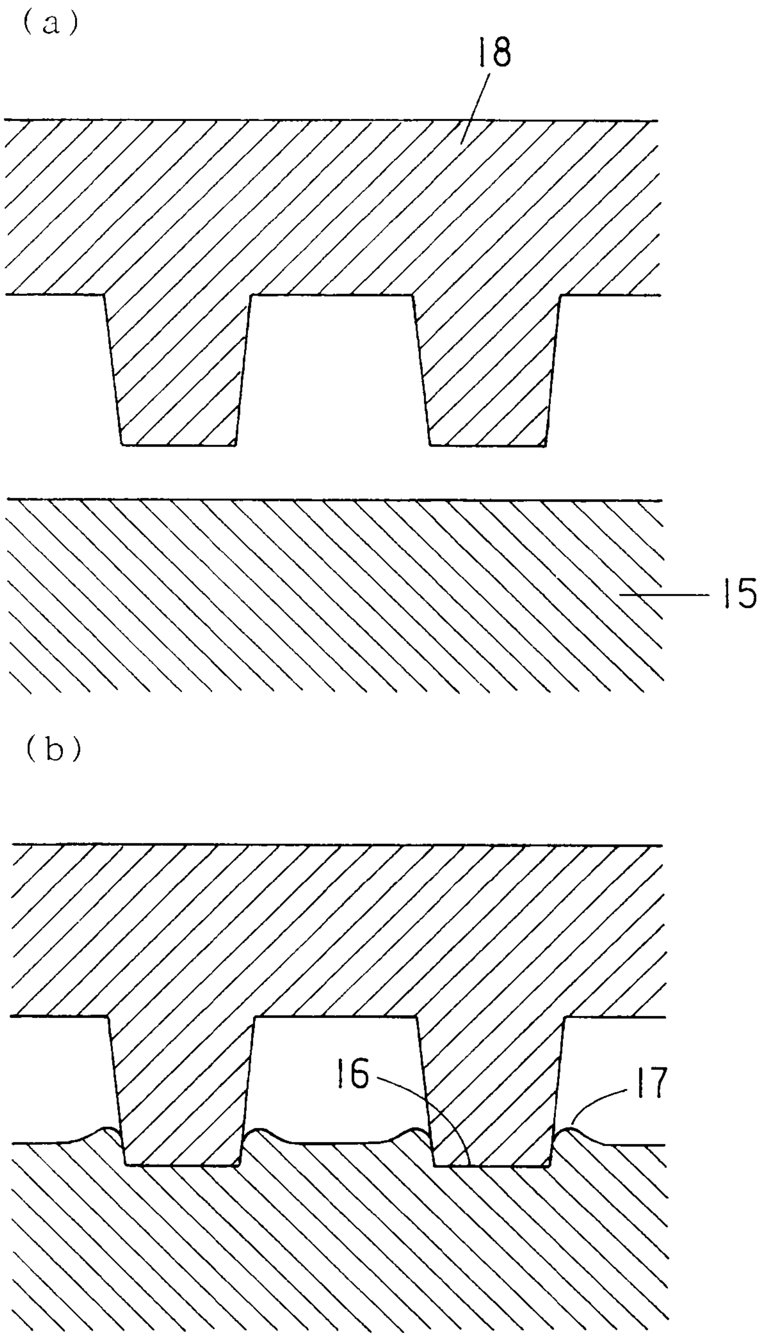
FIGS. 7A and 7B are schematic sectional views illustrating a surface roughening treatment for the copper plate for obtaining the surface coating layer of the embodiment in FIGS. 5A to 5C.

The copper plate 15 is die-cut into the shape of the PCB terminal, and at least a rolled surface (one or both surfaces) that will be used as the fitting portion is subjected to press working so that the surface is roughened alongside, after, or before the die cutting. In the surface roughening treatment, as illustrated in FIG. 7A, a die 18 having a pressing surface where fine protrusions and recesses are formed at substantially constant pitches is set in a pressing machine, and the surface of the copper plate 15 is pressed by the die 18. By the press working, the protrusions (tips of teeth) formed in a truncated pyramid shape (or a prismatic shape) on the pressing surface of the die 18 are pushed into the surface of the copper plate 15, and the recesses 16 are transferred to the surface of the copper plate 15. At the same time, the protrusions 17 having a substantially square ring shape are automatically formed from the material pushed out from the recesses 16 and mounded on the peripheral portion of the recesses 16. The surface of the copper plate around the protrusions 17 retains a relatively flat (plateau-like) shape immediately after finish rolling.

Then, the entire peripheral surface of the copper plate 15 (rolled surface and die-cut end surface) die-cut into the shape of the PCB terminal is, for example, plated with Cu and Sn, and then subjected to the reflow treatment as described above. As a result of the reflow treatment, the Cu—Sn alloy coating layer is formed from Cu of the Cu plating layer and Sn of the Sn plating layer, and the melted Sn flows into the recesses on the surface of the copper plate 15. At the surface-roughened portion, the melted Sn flows into the recesses 16 and the like of the copper plate 15, and the smoothened shape-forming Sn coating layers 11 are formed on the Cu—Sn alloy coating layer 12, as illustrated in FIGS. 6A and 6B. Then, a part of the Cu—Sn alloy coating layer 12 is exposed around the shape-forming Sn coating layers 11. At this time, a part of the Cu plating layer may remain below the Cu—Sn alloy coating layer 12.

When the amount of Sn remaining after the reflow treatment is relatively large, the Sn coating layer 13 is formed on the plateau-like sections on the surface-roughened portion (see FIG. 5B, and FIG. 6B). In the case where the plateau-like sections have a large surface roughness, the Cu—Sn alloy coating layer 12 may be exposed through the Sn coating layer 13. As illustrated in FIG. 6B, the Sn coating layer 13 has a smaller thickness than the shape-forming Sn coating layer 11.

In the examples of FIGS. 5A to 5C and FIGS. 6A and 6B, the closed-contour shape of the shape-forming Sn coating layer 11 is a substantially square shape. However, the shape may be variously different shapes, for example, tetragons such as square, rectangle, rhombus, parallelogram, and trapezoid, polygons such as triangle and hexagon, and circle, ellipse, and race track shape. The group of Sn coating layers having a large number of shape-forming Sn coating layers may include shape-forming Sn coating layers respectively having at least two different shapes. The Sn coating layers may be arranged in a zigzag pattern, for example, other than in a grid pattern as illustrated in FIG. 5B. FIG. 5C is an example in which the shape is circular. The ring-shaped Cu—Sn alloy coating layer 12 is formed around the shape-forming Sn coating layers 11, and the Sn coating layer 13 is further formed around the ring-shaped Cu—Sn alloy coating layer 12. The shape-forming Sn coating layers 11 are preferably distributed substantially evenly on the entire surface where they are formed (roughened surface). The die used to form the recesses 16 on the copper plate 15 may have a truncated corn or pyramid shape or a columnar shape depending on any desired shape.

The shape-forming Sn coating layers 11 have an equivalent circle diameter set in the range of 5 to 1000 μm and a shortest interval between the shape-forming Sn coating layers set in the range of 1 to 2000 μm. The equivalent circle diameter of the shape-forming Sn coating layer and the shortest interval between the shape-forming Sn coating layers are set as above because these ranges allow the shape-forming Sn coating layers and the Cu—Sn alloy coating layer to be suitably exposed together on the outermost surface. This ensures remarkable electrical reliability, and also ensures a lower coefficient of friction, thereby requiring a less insertion force.

More specifically describing, the equivalent circle diameter of the shape-forming Sn coating layers are set to at least 5 μm because formation of the shape-forming Sn coating layer having a smaller area makes it difficult to roughen the surface of the copper plate. On the other hand, if the area of the shape-forming Sn coating layer is excessively large, such an unfavorable event may be invited that the contact point of the counterpart terminal progresses into the shape-forming Sn coating layers, thereby increasing the insertion force. Therefore, the equivalent circle diameter of the shape-forming Sn coating layers is set to at most 1000 μm. Taking into consideration the degree of difficulty in the surface roughening treatment and further downsizing of the PCB terminal in recent years, the equivalent circle diameter of the shape-forming Sn coating layers is desirably 10 to 300 μm, and more desirably 10 to 200 μm.

The shortest interval between the shape-forming Sn coating layers is set to at least 1 μm because, if the interval is smaller than this range, it is difficult to roughen the surface of the copper plate. On the other hand, in the case where the shortest interval between the shape-forming parallel Sn coating layers is excessively large, the following event occurs. The Sn plating layer having a large average thickness lessens an exposure area of the Cu—Sn alloy layer, while increasing that of the Sn layers in the portion between the Sn coating layers, and further excessively reduces the contact area between the counterpart terminal and the Cu—Sn alloy coating layer, thereby causing an increase in the insertion force (insertion force reduction effect is lowered). The Sn plating layer having a small average thickness increases the area occupied by the Cu—Sn alloy layer (the whole area may be occupied by the Cu—Sn alloy layers). Although the coefficient of friction may be reduced, the contact resistance accordingly increases, thereby deteriorating the electrical reliability. Therefore, the interval between the shape-forming Sn coating layers is set to at most 2000 μm. To meet the demand for downsizing of the PCB terminal in recent years, the interval between the shape-forming Sn coating layers is desirably at most 1000 μm, and more desirably at most 250 μm.

It is desirable that the equivalent circle diameter of the shape-forming Sn coating layer and the shortest intervals between the shape-forming Sn coating layers are substantially constant. However, it is not an indispensable requirement.

As illustrated in FIGS. 6A and 6B, the Cu—Sn alloy coating layer 12 exposed on the outermost surface protrude in the height direction from the levels of the shape-forming Sn coating layer 11 and the Sn coating layer 13. Therefore, when the surface roughness is measured in the insertion direction of the PCB terminal (illustrated with white arrows in FIGS. 1A, 1B, 2A, and 2B) for example, the surface roughness is measured as ridge portions of the roughness curve based on JIS B 0601.

The present invention defines that the maximum height roughness Rz in the insertion direction of the PCB terminal is at most 10 μm (including 0 μm) in the surface coating layers illustrated in FIGS. 5A to 5C and FIGS. 6A and 6B, the reason of which is the same as the reason of the surface coating layers illustrated in FIGS. 1A to 3B. The maximum height roughness Rz is desirably larger than 0 μm (slightly protruding) and at most 5 μm.

In the surface coating layer of the fitting portion described so far, the Cu—Sn alloy coating layer is made of one or both of $Cu_6Sn_5$ and $Cu_3Sn$ and has an average thickness of 0.1 to 3.0 μm. This numerical range is equivalent to that of the conventional art (Japanese Patent Nos. 3926355 and 4024244). The Cu—Sn alloy coating layer having an average thickness below 0.1 μm deteriorates the corrosion resistance of the material surface, increasing oxides possibly generated, and the contact resistance is likely to increase, making it difficult to maintain the electrical reliability. On the other hand, an average thickness exceeding 3 μm is a disadvantage to cost reduction and results in a poor productivity. Therefore, the average thickness of the Cu—Sn alloy coating layer is desirably 0.1 to 3.0 μm, and more desirably 0.2 to 1.0 μm.

The Cu—Sn alloy coating layer desirably has an exposure area ratio of 3 to 75%. The exposure area ratio is a value in which a surface area of the Cu—Sn alloy coating layer exposed per unit area of the material is multiplied by 100. The exposure area ratio below 3% makes it difficult to obtain a low coefficient of friction because more adhesion is caused on the material surface. However, even in the case where the exposure area ratio is below 3%, which may fail to adequately reduce the coefficient of friction, still achieves some reduction as compared to no surface exposure. On the other hand, the exposure area ratio exceeding 75% increases oxides, such as Cu, generated on the material surface with time or due to corrosion. As a result, the contact resistance is likely to increase, resulting in failure to maintain the reliability of electrical connection. Therefore, the exposure area ratio of the Cu—Sn alloy coating layer is desirably 3 to 75%. This numerical range is equivalent to that of the conventional art (Japanese Patent Nos. 3926355 and 4024244). A more desirable range is 10 to 50%.

The Sn coating layer is made of Sn metal or Sn alloy. When the Sn alloy is used, examples of an alloying element are Cu, Ag, Ni, Bi, In, and Zn. These alloying elements are preferably contained at most 10% by mass. The Sn coating layer has an average thickness of 0.2 to 5.0 μm. This numerical range is equivalent to that of the conventional art (Japanese Patent Nos. 3926355 and 4024244). The Sn coating layer having an average thickness below 2 μm increases oxides of Cu generated on the material surface due to thermal diffusion caused by high-temperature oxidation. As a result, the contact resistance is likely to increase, and the corrosion resistance weakens, so as to make it difficult to maintain the electrical reliability. On the other hand, the Sn coating layer having an average thickness exceeding 5.0 μm is a disadvantage to cost reduction and results in a poor productivity. Therefore, the average thickness of the Sn alloy coating layer is set to 0.2 to 5.0 μm, and desirably to 0.5 to 3.0 μm.

The Ni coating layer may be formed between the surface of the copper plate and the Cu—Sn alloy coating layer as a part of the surface coating layer of the fitting portion in the PCB terminal. The Cu coating layer may be further formed between the Ni coating layer and the Cu—Sn alloy coating layer, or the Cu coating layer may be further formed between the surface of the copper plate and the Ni coating layer. The Ni coating layer has an average thickness equal to or smaller than 10 μm (including 0 μm), and desirably 0.1 to 10 μm. The Cu coating layer has an average thickness equal to or smaller than 5 μm (including 0 μm).

These coating layers are formed by plating. As described above, the Cu coating layer between the Ni coating layer and the Cu—Sn alloy coating layer is a Cu plating layer remaining below the Cu—Sn alloy coating layer after the reflow treatment. The Ni coating layer serves as a barrier layer which blocks the alloying elements included in Cu and the base material diffusing from the base material (copper plate) of the PCB terminal. The CU coating layer between the surface of the copper plate and the Ni coating layer serves to improve the adhesion of the Ni coating layer.

The Ni coating layer is made of metal Ni or Ni alloy. Examples of the alloying element in the case of Ni alloy are Cu, P, and Co. Cu is preferably contained at most 40% by mass, P and Co are preferably contained at most 15% by mass. The Cu coating layer is made of metal Cu or Cu alloy. Examples of the alloying element in the case of Cu alloy are Sn and Zn. Sn is preferably contained less than 50% by mass, and the other elements are preferably contained at most 5% by mass.

A further description to the method for manufacturing the fitting portion of the PCB terminal will be given below.

Japanese Patent Nos. 3926355 and 4024244, and Japanese Unexamined Patent Publication No. 2007-258156 disclose examples of the surface roughening treatment; physical methods such as ion etching, chemical methods such as etching and electrolytic polishing, metal rolling (using work roll roughened by polish or shot blast), and mechanical methods such as polishing and shot blast. However, any of these methods is not suitable for the formation of the Sn coating layers being as a plurality of essentially parallel lines and the Cu—Sn alloy coating layer adjacent thereto on both sides thereof, or the shape-forming Sn coating layers being as shapes each formed by a closed contour and the Cu—Sn alloy coating layer surrounding the shape-forming Sn coating layers.

Meanwhile, Japanese Unexamined Patent Publication Nos. 2008-269999 and 2008-274364 disclose the technique of roughening the copper plate surface when cut into the terminal shape. More specifically, the copper plate is die-cut to form a copperplate having terminal materials continuously connected by band-shape coupling sections like chains in a length direction thereof, and the copper plate is subjected to press working alongside, after, or before the die cutting so that the terminal materials (copper plate) have an increased surface roughness. However, Japanese Unexamined Patent Publication Nos. 2008-269999 and 2008-274364 fail to recite any specific description of the press working.

The Cu—Sn alloy coating layer is exposed through the protrusions formed on the roughened surface of the copper plate (irregularity is mechanically formed) after the reflow treatment. Therefore, the irregularity formed on the surface of the copper plate during the surface roughening treatment is reflected on the exposure of the Cu—Sn alloy coating layer and the Sn coating layer.

As described above with reference to FIGS. 4A and 4B and FIGS. 7A and 7B, the surface roughening treatment according to the present invention can employ such a method that a die having fine protrusions and recesses formed on its pressing surface is set in a press machine, and the surface of the copper plate (portion that will be used as the fitting portion of the PCB terminal) is pressed by the die so that the protrusions are pressed into the surface of the copper plate. According to this method, the Sn coating layer and the Cu—Sn alloy coating layer can be exposed as defined by the present invention. Further, the widths of the parallel Sn coating layers, the intervals between the parallel Sn coating layers, the equivalent circle diameter of the shape-forming Sn coating layers, and the shortest interval between the shape-forming Sn coating layers are arbitrarily controllable by selecting a suitable die or combining the dies. The protrusions and recesses are formed on the pressing surface of the die 1 by electrical discharge machining, polishing, laser processing, or etching. Any of these techniques can be selected depending on desirable shapes and dimensional accuracy. The shapes and the formation pitches of the protrusions are not necessarily uniform.

In order to distribute the parallel Sn coating layers 1 and 4 or the shape-forming Sn coating layers 11 substantially evenly on the whole surface where the layers are formed (roughened surface), it is necessary to form the recesses 6 or 16 and the protrusions 7 substantially evenly on the entire surface to be roughened.

After the die cutting into the terminal shape and surface roughening, the copper plate is subjected to so-called after-plating. Describing the after-plating, the Cu plating layer and the Sn plating layer are formed in this order after Ni plating is performed if necessary, and the copper plate is manufactured by performing the reflow treatment. If necessary, the Cu plating layer may be formed below the Ni plating layer to improve the adhesion of the Ni plating layer, or the Sn plating layer alone may be formed directly on the surface of the copper plate.

The after-plating may be performed to the whole length of the PCB terminal (when after-plating is performed to the soldering portion and the intermediate portion as well as the fitting portion), or after-plating may be performed only to the portion that will be used as the fitting portion of the PCB terminal (when after-plating performed to the soldering portion and the intermediate portion is different from after-plating for the fitting portion).

When the post-after-plating copper plate is subjected to the reflow treatment, Cu in the Cu plating layer and Sn in the Sn plating layer mutually diffuse, forming the Cu—Sn alloy coating layer, and the Sn plating layer thereafter remains. The Cu plating layer may entirely disappear or may partly remain. When the Cu plating layer partly remains, the Cu coating layer is formed between the surface of the copper plate (surface of the Ni coating layer when the Ni plating layer is formed) and the Cu—Sn alloy coating layer. When the formation of the Ni plating layer is omitted, Cu may also be supplied from the copperplate (base material) depending on the thickness of the Cu plating layer. When the Sn plating layer alone is formed directly on the surface of the copper plate, Cu in the copper plate (base material) and Sn in the Sn plating layer is mutually diffused, thereby forming the Cu—Sn alloy coating layer.

The Cu plating layer desirably has an average thickness of 0.1 to 1.5 μm. The Sn plating layer desirably has an average thickness of 0.3 to 8.0 μm. The Ni plating layer desirably has an average thickness of 0.1 to 10 μm.

According to the present invention, the Cu plating layer, Sn plating layer, and Ni plating layer respectively include not only Cu, Sn, and Ni metals but also Cu alloy, Sn alloy, and Ni alloy. When the Cu plating layer, Sn plating layer, and Ni plating layer respectively include Cu alloy, Sn alloy, and Ni alloy, the respective alloys may be composed of the same composition ratios as the respective alloys of the Cu coating layer, Sn coating layer, and Ni coating layer described above.

(Soldering Portion of PCB Terminal)

The soldering portion of the PCB terminal is inserted in a through hole of the PCB and soldered thereto so that the PCB terminal is firmly secured to the PCB. In order to ensure the electrical reliability, it is necessary that a solder be evenly spread in portions in contact with the solder of the soldering portion during the soldering. To this end, it is necessary to form the Sn coating layer having a thickness equal to or larger than a certain thickness on the soldering portion.

The soldering portion may be plated separately from the fitting portion or plated together with the fitting portion. In either case, the Sn coating layer has an average thickness of 0.2 to 10 μm. The Sn coating layer having an average thickness below 0.2 μm deteriorates the solderability. On the other hand, the Sn coating layer having an average thickness exceeding 10 μm is a disadvantage to cost reduction and results in poor productivity. Therefore, the average thickness of the Sn coating layer is set to 0.2 to 10 μm, and more desirably to 0.5 to 5 μm. The Sn coating layer is desirably formed so as to coat the entire outermost surface of the soldering portion.

The Sn coating layer is made of Sn metal or Sn alloy. The composition of Sn alloy may be same as described above.

It is desirable that the Cu—Sn alloy coating layer or Ni—Sn alloy coating layer be formed below the Sn coating layer (between the Sn coating layer and the copper plate) as a part of the surface coating layer formed on the soldering portion of the PCB terminal. It is also desirable that the Ni coating layer be formed further therebelow (between the Cu—Sn alloy coating layer or the Ni—Sn alloy coating layer and the copper plate). The Cu coating layer may be provided below the Ni coating layer (between the Ni coating layer and the copper plate). In the case where the Ni coating layer is provided below the Cu—Sn alloy coating layer, the Cu coating layer may be provided between these two coating layers.

The Ni coating layer and the Cu coating layer are made of Ni metal or Ni alloy, and Cu metal or Cu alloy. The Sn alloy, Ni alloy, and Cu alloy may consist of the same composition as described above.

The Cu—Sn alloy coating layer, Ni—Sn alloy coating layer, and Ni coating layer all serve as barrier layers which block Cu and the alloying elements contained in the base material to be diffused from the base material (copper plate) of the PCB terminal. In the case where Cu and the alloying element contained in the base material being diffused to the Sn coating layer arrive at the surface and are oxidized, in the absence of the barrier layers, the solderability and solder spreadability deteriorate, whereby reliable bonding may be prevented.

The Cu—Sn alloy coating layer and the Ni—Sn alloy coating layer have an average thickness equal to or smaller than 3 μm (including 0 μm), and the Ni coating layer has an average thickness equal to or smaller than 10 μm (including 0 μm). When the Cu—Sn alloy coating layer and the Ni—Sn alloy coating layer have an average thickness exceeding 3 μm, and the Ni coating layer has an average thickness exceeding 10 μm, competitiveness in terms of cost is lowered and result in poor productivity.

The Cu coating layer between the surface of the copper plate and the Ni coating layer helps to improve the adhesion of the Ni coating layer. The Cu coating layer has an average thickness equal to or smaller than 5 μm (including 0 μm).

The Cu—Sn alloy coating layer is formed from Cu of the Cu plating layer and Sn of the Sn plating layer, and the Ni—Sn alloy coating layer is formed from Ni of the Ni coating layer and Sn of the Sn plating layer through the reflow treatment. The Cu coating layer below the Cu—Sn alloy coating layer (between the copper plate and the Cu—Sn alloy coating layer, or between the Ni coating layer and the Cu—Sn alloy coating layer) is a residual Cu plating layer resulting from the reflow treatment. The Ni coating layer below the Ni—Sn alloy coating layer is a residual Ni plating layer resulting from the reflow treatment. The residual Cu coating layer has an average thickness equal to or smaller than 5 μm (including 0 μm).

The Cu plating layer, Ni plating layer, and Sn plating layer are respectively made of Cu metal or Cu alloy, Ni metal or Ni alloy, and Sn metal or Sn alloy. When the Cu plating layer is made of Cu alloy or the Sn plating layer is made of Sn alloy, the Cu—Sn alloy coating layer includes an alloying element other than Cu and Sn. When the Ni plating layer is made of Ni alloy or the Sn plating layer is made of Sn alloy, the Ni—Sn alloy coating layer includes an alloying element other than Ni and Sn. The Cu alloy of the Cu plating layer, Ni alloy of the Ni plating layer, and Sn alloy of the Sn plating layer may respectively consist of same composition as described above.

When the plating and reflow treatment are performed after the soldering portion is surface-roughened together with the fitting portion, the Cu—Sn alloy coating layer is also possibly exposed on the outermost surface on the soldering portion. Particularly when the soldering portion is surface-roughened and plated in exactly the same manner as the fitting portion, the Cu—Sn alloy coating layer is unexceptionally exposed on the outermost surface. To avoid this problem, the Sn coating layer smoothened by the reflow treatment is desirably plated with Sn again so that the outermost surface of the soldering portion is entirely coated with the Sn plating layer to improve the solderability and solder spreadability. Although the Cu—Sn alloy coating layer is not exposed on the outermost surface without the surface roughening, even in such cases, the surface of the Sn coating layer smoothened by the reflow treatment can be additionally plated with Sn.

From the perspective of cost reduction and productivity, the Sn plating layer has an average thickness equal to or smaller than 0.3 μm. The Sn plating layer and the post-reflow Sn coating layer have an average thickness in total of 0.2 to 10 μm. The Sn plating layer is made of Sn metal or Sn alloy. The Sn alloy may consists of the same composition as described above. The Sn plating may be any of gloss Sn plating, semi-gloss Sn plating, and matte Sn plating.

(Intermediate Portion of PCB Terminal)

For the intermediate portion of the PCB terminal, any of solderability, solder spreadability, and electrical reliability (low contact resistance even after prolonged heating) is not required. Therefore, it is unnecessary to form the surface coating layer on the intermediate portion. However, if it is desirable in view of improving corrosion resistance, the intermediate portion may be coated with one or at least two of the Sn coating layer, Ni coating layer, Cu coating layer, and Cu—Sn alloy coating layer. The intermediate portion may be coated with the same surface coating layer as those of the fitting portion and the soldering portion. Further, the intermediate portion may be surface-roughened in the same manner as the fitting portion.

(Die Cutting and Chamfering of PCB Terminal)

Figure 8:
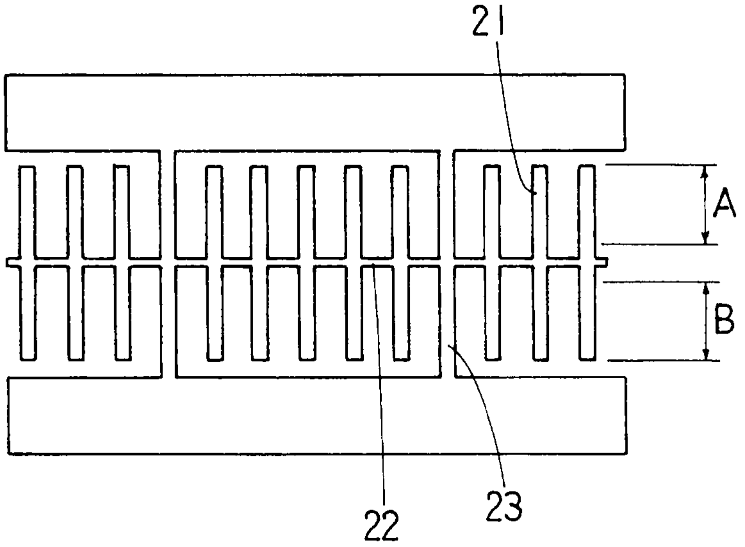
FIG. 8 is a plan view of the copper plate after die cutting work is applied thereto.

The PCB terminal is produced by die-cutting a copper alloy strip by progressive press working. FIG. 8 is a plan view of the die-cut copper alloy strip, wherein a reference numeral 21 denotes a PCB terminal portion, and reference numerals 22 and 23 denote joints. After the plating and reflow treatment (after Sn plating when the Sn plating is further performed after the reflow treatment), the PCB terminal portions 21 are cut away from one another at the joints 22. The PCB terminals are die-cut by one of methods respectively called unilateral cutting and bilateral cutting. The unilateral cutting is to press-cut one of both end surfaces of each PCB terminal 21 at a time. The bilateral cutting is to press-cut the both end surfaces at the same time.

Figure 9:
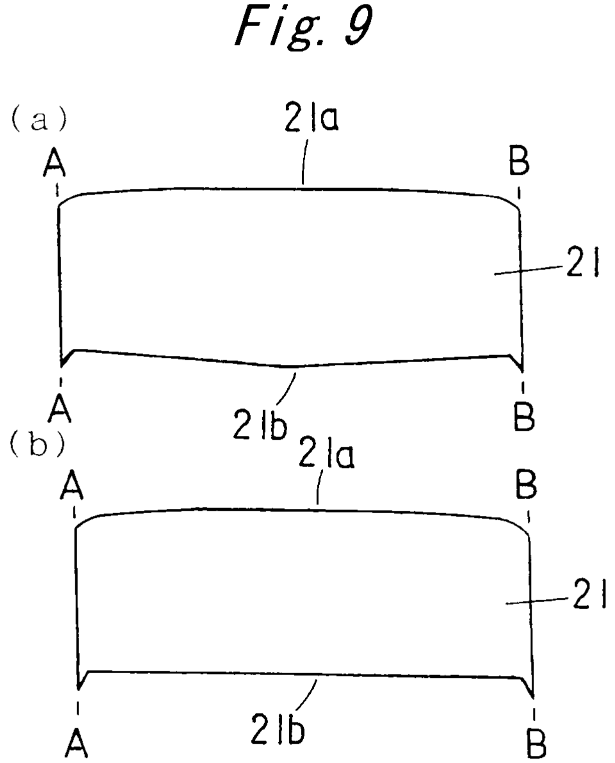
FIGS. 9A and 9B are sectional views of a PCB terminal portion after the die cutting work.

FIG. 9A is a sectional view of the PCB terminal 21 unilaterally cut. An upper surface 21*a*, a lower surface 21*b*, and surfaces on both sides 21*c* and 21*d* are the die-cut end surfaces. The PCB terminal 21 is vertically die-cut (sheared) along line A-A and then die-cut (sheared) along line B-B. In the sectional view after the die cutting, the upper surface 21*a* is slightly curved upward, there are shear drops in corner portions on the upper-surface side, the lower surface 21*b* has tilts in opposite directions starting at the center in its width direction, and there are burrs in corner portions on the lower-surface side. The tilts of the lower surface 21*b* are generated because a force that rotates the material during the cutting work is applied thereto on each side.

FIG. 9B is a sectional view of the PCB terminal 21 bilaterally cut. The PCB terminal is vertically die-cut (sheared) along both lines A-A and B-B at once. The PCB terminal is substantially the same as that of FIG. 9A except that the lower surface 21*b* is relatively flat in the sectional view because the material is not rotated during the die cutting.

The degrees of the curve of the upper surface 21*a*, shear drops of the upper-surface corner portions, and the burrs of the corner portions of the lower-surface 21*b* illustrated in FIGS. 9A and 9B are variable depending on the clearances of an upper die and a lower die used for the terminal die cutting work.

After the PCB terminal 21 having such a sectional shape is plated with Sn and then subjected to the reflow treatment, although the Sn plating layer before the reflow treatment may have a substantially equal thickness on the entire sectional surface, the post-reflow Sn coating layer has an uneven thickness on the whole, a large thickness at the center of the upper surface 21*a*, a small thickness in the upper-surface corner portions, a large thickness in the lower-surface corner portions, and small thickness at the center of the lower surface 21*b*. When the Sn coating layer thus fails to have an even thickness, the coefficient of friction may be larger than a target value in the fitting portion depending on which section of the counterpart terminal contacts the fitting portion, or the solderability may be lowered in the soldering portion. Further, the Sn coating layer may be scraped at the burred portions when inserted in the through hole, or the Sn coating layer is likely to be peeled at the burred portions.

Figure 10:
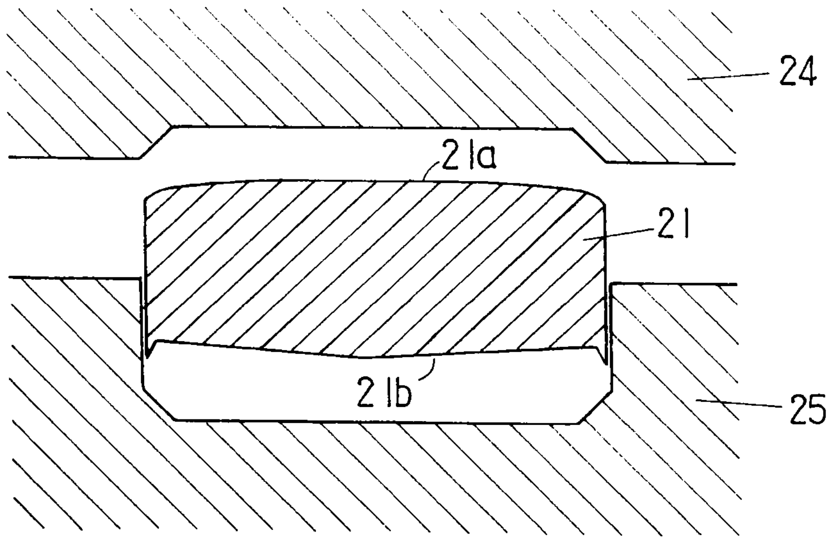
FIG. 10 is a sectional view illustrating a chamfering process.

To prevent such an uneven thickness of the Sn coating layer, it is effective to perform a press chamfering process on the PCB terminal during the progressive press working; round chamfer or C chamfer in the corner portions on the upper-surface side and/or the lower-surface side. The upper surface 21*a* may be flattened at the same time. The round chamfer is to round the corner portions in an arc shape, and the C chamfer is to taper the corner portions. FIG. 10 illustrates an example of the press chamfering process. A chamfering portion of an upper die 24 has a flat portion for the upper surface 21*a* of the PCB terminal and tilting portions for the upper-surface corner portions of the PCB terminal 21 on both ends of the flat portion. A chamfering portion of a lower die 25 has a flat portion for the lower surface 21*b* of the PCB terminal and tilting portions for the lower-surface corner portions of the PCB terminal 21 on both ends of the flat portion. The two dies 24 and 25 are vertically pressed to the copper plate cut in the same width of the PCB terminal. This chamfering process is followed by the surface roughening treatment.

EXAMPLES

Manufacturing of Copper Plate

Plating Base Material

A copper plate used in this example contained Ni by 1.8% by mass, Si by 0.40% by mass, Zn by 1.1% by mass, and Sn by 0.10% by mass in Cu, and had the Vickers hardness of 180 and the thickness of 0.25 mm.

A test piece in the size of 100 mm×400 mm (rolling longitudinal direction×perpendicular direction) was cut out from the copper plate. A part having predetermined protrusions and recesses on the pressing surface was attached to a predetermined position of a progressive die used to mold the PCB terminal (position after the die cutting into the shape of the PCB terminal or position after the chamfering), and the PCB terminal in the size of W 1 mm×L 22 mm or W 3 mm×L 22 mm was die-cut at 5 mm pitches (unilateral cutting or bilateral cutting). Then, the PCB terminal portion 21 was chamfered as described with reference to FIG. 10 (excluding some of test pieces), and the portions of the PCB terminal 21 that will be formed into the fitting and soldering portions were surface-roughened (excluding some of test pieces). The surface roughening was performed to only one of the rolled surfaces (upper surface). A large number of fine protrusions and recesses were regularly formed on the entire surfaces to be roughened of the portions for the fitting and soldering portions substantially evenly in parallel with one another (in the case of linear recesses), in a grid pattern, or a zigzag pattern (in the case of shape-forming recesses). When a part having differently formed protrusions and recesses is used in the surface roughening, or the part is pressed a plurality of times, variously different fine recesses can be formed on the surface of the copper alloy plate. In FIG. 8, a range A (L 10 mm) marked with arrows of the PCB terminal portion 21 is the portion for the fitting portion of the PCB terminal, and a range B (L 10 mm) is the portion for the soldering portion of the PCB terminal.

(Example of Fitting Portion)

Then, Ni plating, Cu plating, and Sn plating were performed in this order to the entire portion of the copper plate for the fitting portion of the PCB terminal (the Ni plating was omitted for some of test pieces, and the Cu plating was performed prior to the Ni plating in some of test pieces), and the reflow treatment was performed thereto at 280° C. for 10 seconds. Then, the PCB terminals were cut away from one another so that test pieces Nos. 1 to 37 were obtained.

Figure 11:
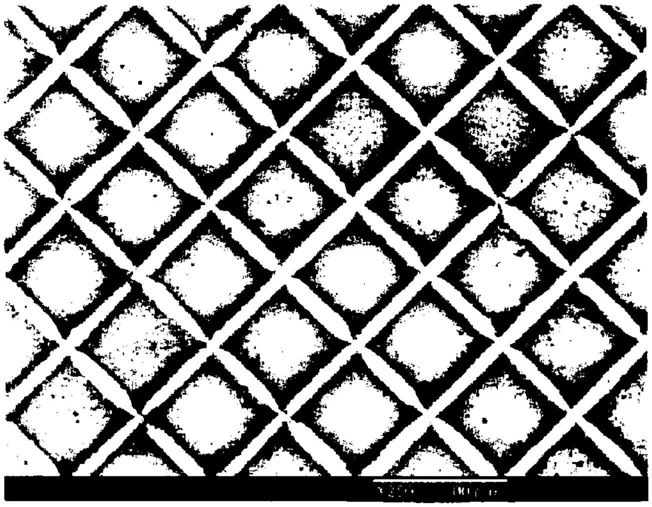
FIG. 11A is a surface SEM photograph (composition image) of a PCB terminal test piece in No. 7 of an example.
FIG. 11B is a roughness curve B of a PCB terminal test piece in No. 1 of the example.
Figure 11:
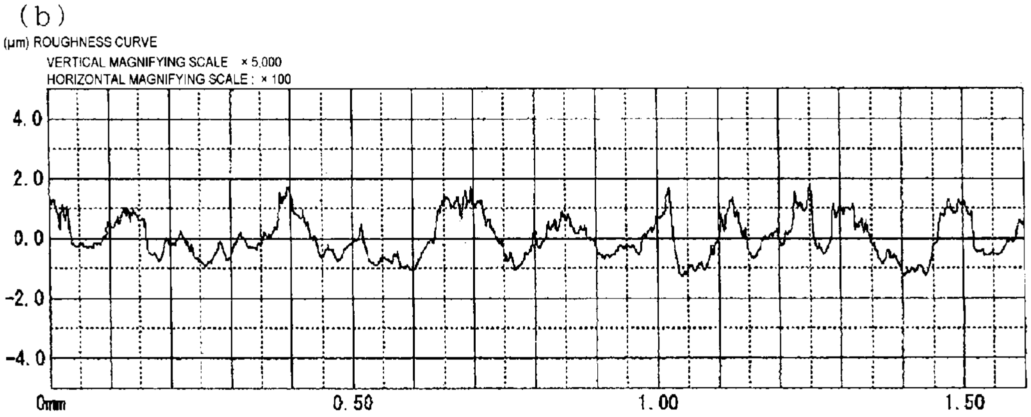

FIG. 11A shows a surface SEM (scanning electron microscope) photograph (composition image) of No. 7. In the figure, white sections are the Sn coating layer, and black sections are the Cu—Sn alloy coating layer. The Sn coating layer of FIG. 11A includes two groups of Sn coating layers respectively being as a plurality of essentially parallel lines. One of the groups of Sn coating layers and the other group of Sn coating layers intersect with each other at the angle of 90 degrees, constituting a grid pattern on the whole. In the example of FIG. 11A, after the surface roughening, fine grooves (valleys) being as a plurality of essentially parallel lines are formed so as to intersect with one another at the angle of 90 degrees on the surface of the PCB terminal prior to the plating. These grooves constitute a grid pattern on the whole.

Tables 1 to 4 show surface statuses of surface coating layers of the respective test pieces, average thickness of the coating layers constituting the respective surface coating layers, and whether the chamfering process was performed thereto. In Table 1, a straight line X denotes a parallel Sn coating layer X constituting one of the groups of Sn coating layers, and a straight line Y denotes a parallel Sn coating layer Y constituting the other group of Sn coating layers. In the case where only one of the groups of Sn coating layers is present, the column of the Sn coating layer Y (straight line Y) is left blank. The test pieces in which any of the followings exceeds 500 μm; widths of the Sn coating layer X and the Sn coating layer Y, interval between the Sn coating layers X, interval between the Sn coating layers Y, equivalent circle diameter of the shape-forming Sn coating layer, and shortest interval between the shape-forming coating layers are press-cut into 3 mm width to be used as the PCB terminals. The other test pieces are press-cut into 1 mm width to be used as the PCB terminals.

Nos. 1 to 16, 18, and 20 to 37 were obtained by the unilateral cutting, No. 17 was obtained by the bilateral cutting, and No. 19 was obtained by the bilateral cutting followed by only squashing burrs in the press chamfering process.

The following describes parameters indicating the surface statuses of the test pieces and a method for measuring the average thickness of the respective coating layers (which were all measured on the roughened rolled surfaces).

[Maximum Height Roughness RZ]

The maximum height roughness Rz was measured by contact-type roughness measuring equipment (SURFCOM 1400 manufactured by Tokyo Seimitsu Co., Ltd.) based on JIS B 0601: 2001. The surface roughness measuring conditions were; cut-off value: 0.8 mm, reference length: 0.8 mm, assessment length: 4.0 mm, measurement speed: 0.3 mm/s, and radius of contact needle edge: 5 μmR. The measurement was performed at three different positions on the roughened surface in the PCB terminal insertion direction. The maximum height roughness Rz was obtained from the roughness curves respectively obtained, and the largest value thereof was identified as the maximum height roughness Rz of each test piece. The maximum height roughness Rz had almost the same value at all of the measurement positions. FIG. 11B shows an example of the roughness curve measured in No. 1.

[Width of Sn Coating Layer]

The surfaces of the test pieces were observed by a scanning electron microscope (SEM), and the widths of the Sn coating layers X and Y, the interval between the straight lines X and Y, and the equivalent circle diameter of the shape-forming Sn coating layer shown in Table 3 and the shortest interval between the shape-forming Sn coating layers (shortest interval between the adjacent shape-forming Sn coating layers) were measured from composition images respectively obtained. The intersecting angle in the insertion direction shown in Table 3 is an interesting angle formed by a side of the shape of the shape-forming Sn coating layer (square) and the insertion direction. The intersecting angle formed by the straight lines X and Y, the intersecting angle formed by the straight line X and the insertion direction, and the intersecting angle formed by a side of the shape and the insertion direction were set in the stage of the surface roughening. The magnifying scale of the scanning electron microscope during the observation was changed depending on the widths of the parallel Sn coating layers X and Y, the interval between the straight lines X and Y, and the equivalent circle diameter of the shape-forming Sn coating layers shown in Table 3 and the shortest interval between the shape-forming Sn coating layers. The SEM image was photographed for each test piece in three fields of view. The widths of the parallel Sn coating layers X and Y, the interval between the straight lines X and Y, and the shortest interval between the shape-forming Sn coating layers were measured at three different positions on each of the photographed images, and an average value of the measured values in three photographs (number of data: 9) was calculated. The equivalent circle diameter of the shape-forming Sn coating layer shown in Table 3 was also obtained for each of the photographed images by an image analyzer, and an average value was similarly calculated from three photographed images.

[Average Thickness of Sn Coating Layer]

First, a summed value of the thickness of the Sn coating layer and the film thickness of the Sn component contained in the Cu—Sn alloy coating layer was measured by X-ray fluorescence film thickness measuring equipment (SFT 3200 manufactured by Seiko Instruments Inc.). Then, the test pieces were each dipped in an aqueous solution containing p-nitrophenol and caustic soda for 10 minutes so that the Sn coating layer was removed. Again, the film thickness of the Sn component contained in the Cu—Sn alloy coating layer was measured by the X-ray fluorescence film thickness measuring equipment. For the measurement, monolayer calibration of Sn/base material was used as a calibration curve for each of the test pieces, and a collimator diameter was set to ϕ 0.5 mm.

Figure 12:
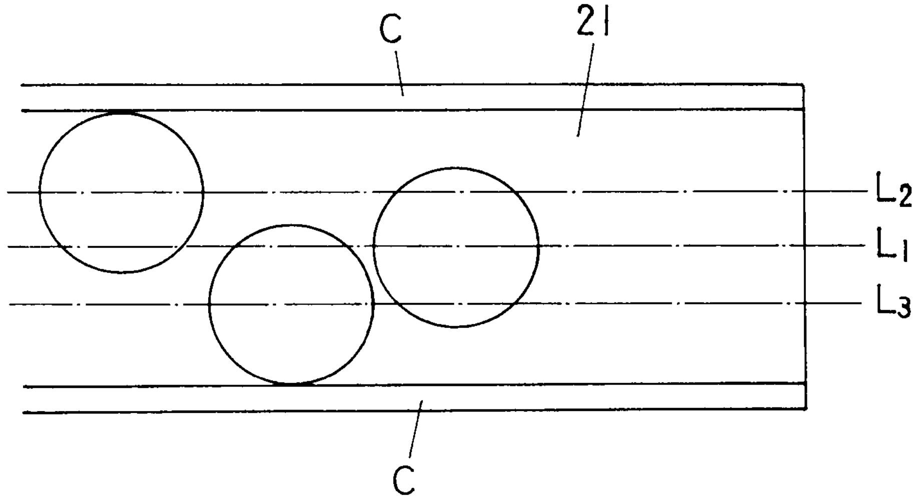
FIG. 12 is a schematic view illustrating a method for measuring an average thickness of a Sn coating layer in the example.

To measure the summed value of the thickness of the Sn coating layer and the film thickness of the Sn component contained in the Cu—Sn alloy coating layer, a center position in the width direction of each test piece (direction orthogonal to the longitudinal direction) and two positions on lateral sides of the center position (three positions in total) were selected as measurement positions. At each of the positions, measurement points were an inward position away by 1 mm from the longitudinal end and 10 points in the longitudinal direction apart by 0.5 mm pitches from the inward position, and an average value of the measured values at three positions×10 points=30 points was obtained. FIG. 12 is a schematic view of the measurement position and measurement points of the test piece 21 having the width of 1 mm. The measurement at the center position was performed along center line L1 in the width direction of the test piece 21. The measurement at the positions on the lateral sides of the center position was performed along straight lines L2 and L3 in parallel with the straight line L1. As the measurement positions, as illustrated in FIG. 12, such positions were selected in which the edge of X-ray flux applied from the collimator does not overlap by a narrow margin on the rounded portions on the ends (corner portions) of the test pieces in the width direction, tilting surfaces (test pieces subjected to the round chamfer or C chamfer), or shear drops (test pieces not chamfered). In FIG. 12, marks of "o" illustrate the X-ray flux at the respective measurement positions, and a reference numeral C denotes the rounded portions, tilting surfaces, or shear drops formed on the width-direction ends (corner portions) of the test pieces. In any test pieces having the width of 3 mm, a center position in the width direction of each test piece and inward positions away from the ends by 0.5 mm in the width direction (three points in total) were selected as the measurement positions.

The film thickness of the Sn component included in the Cu—Sn alloy coating layer was also measured in a similar manner. The film thickness of the Sn component included in the Cu—Sn alloy coating layer was subtracted from the summed film thicknesses of the Sn coating layer and the Sn component included in the Cu—Sn alloy coating layer, and a value thereby obtained was used as an average thickness of the Sn coating layer.

[Average Thickness of Cu—Sn Alloy Coating Layer]

First, the test pieces were each dipped in an aqueous solution containing p-nitrophenol and caustic soda for 10 minutes so that the Sn coating layer was removed. The film thickness of the Sn component contained in the Cu—Sn alloy coating layer was measured by the X-ray fluorescence film thickness measuring equipment (SFT 3200 manufactured by Seiko Instruments Inc.). For the measurement, monolayer calibration of Sn/base material was used as a calibration curve for each of the test pieces, and the collimator diameter was set to p 0.5 mm. The measurement positions, measurement points, and measurement scores were as described in the section of Average Thickness of Sn Coating Layer. A value thereby obtained was used as an average thickness of the Cu—Sn alloy coating layer.

[Average Thickness of Cu Coating Layer]

The sectional surface of the base material processed by a microtome technique was observed by the SEM (scanning electron microscope) at the magnifying scale of 10,000, so that an average thickness was calculated through an image analysis.

[Average Thickness of Ni Coating Layer]

An average thickness was calculated by the X-ray fluorescence film thickness measuring equipment (SFT 3200 manufactured by Seiko Instruments Inc.) (the average value was calculated from values measured at three positions in each test piece). For the measurement, bilayer calibration of Sn/Ni/base material was used as a calibration curve for each of the test pieces, and the collimator diameter was set to ϕ 0.5 mm.

[Exposure Area Ratio of Cu—Sn Alloy Coating Layer]

The surfaces of the test pieces were observed by the SEM (scanning electron microscope) mounted with EDX (energy dispersive X-ray spectroscopy) at the magnifying scale of 200 so that the exposure area ratio of the Cu—Sn alloy coating layer of each test piece was measured through image analysis of contrasting density of a composition image thereby obtained (except any contrast resulting from smear or scratch). In the case where a repetitive unit of the parallel Sn coating layer or the shape-forming Sn coating layer fails to come in one field of view because the widths of or the intervals between the parallel Sn coating layers or the equivalent circle diameter of the shape-forming Sn coating layer is too large, the field of view was shifted to observe and measure an area larger than one field of view (area larger than the repetitive unit).

TABLE 1

Table 1: Status of Surface Coating Layer

| No. | Maximum height roughness Rz (μm) | Width of Sn coating layer X (μm) | Width of Sn coating layer Y (μm) | Interval between straight lines: Straight line X (μm) | Interval between straight lines: Straight line Y (μm) | X/Y intersecting angle (degree) | X/insertion direction intersecting angle (degree) | Exposure area ratio of Cu—Sn coating layer (%) |
|---|---|---|---|---|---|---|---|---|
| 1 | 3.2 | 20 | 20 | 80 | 80 | 90 | 45 | 30 |
| 2 | 3.2 | 20 | 20 | 80 | 500 | 90 | 45 | 20 |
| 3 | 0.9 | 400 | 70 | 80 | 80 | 90 | 45 | 9 |
| 4 | 5.3 | 70 | 30 | 200 | 400 | 60 | 60 | 18 |
| 5 | 0.2 | 1 | 1 | 3 | 3 | 10 | 90 | 70 |
| 6 | 1.1 | 200 | 200 | 300 | 300 | 90 | 90 | 7 |
| 7 | 2.2 | 15 | 15 | 80 | 80 | 90 | 45 | 30 |
| 8 | 0.4 | 3 | 3 | 1 | 1 | 10 | 90 | 4 |
| 9 | <0.1 | 450 | 450 | 1000 | 1000 | 90 | 30 | 3 |
| 10 | 8.3 | 15 | 15 | 300 | 300 | 90 | 90 | 43 |
| 11 | 2.3 | 25 | — | 80 | — | — | 90 | 28 |
| 12 | 1.8 | 8 | — | 40 | — | — | 90 | 21 |
| 13 | 3.4 | 25 | 25 | 750 | 750 | 90 | 90 | 43 |
| 14 | 10.0 | 40 | 40 | 1500 | 1500 | 90 | 45 | 75 |
| 15 | 1.1 | 490 | 490 | 2000 | 2000 | 90 | 45 | 3 |
| 16 | 3.2 | 20 | 20 | 80 | 80 | 90 | 45 | 30 |
| 17 | 3.2 | 20 | 20 | 80 | 80 | 90 | 45 | 30 |
| 18 | 3.2 | 20 | 20 | 80 | 80 | 90 | 45 | 30 |
| 19 | 3.2 | 20 | 20 | 80 | 80 | 90 | 45 | 30 |
| 20 | 2.7 | 20 | — | 80 | — | — | 90 | 30 |
| 21 | 3.2 | 20 | 20 | 80 | 80 | 90 | 45 | 30 |

TABLE 1-continued

Table 1: Status of Surface Coating Layer

| No. | Maximum height roughness Rz (μm) | Width of Sn coating layer X (μm) | Width of Sn coating layer Y (μm) | Interval between straight lines: Straight line X (μm) | Interval between straight lines: Straight line Y (μm) | X/Y intersecting angle (degree) | X/insertion direction intersecting angle (degree) | Exposure area ratio of Cu—Sn coating layer (%) |
|---|---|---|---|---|---|---|---|---|
| 22 | 3.2 | 20 | 20 | 80 | 80 | 90 | 45 | 30 |
| 23 | 3.2 | 20 | 20 | 80 | 80 | 90 | 45 | 78 |
| 24 | 3.2 | 20 | 20 | 80 | 80 | 90 | 45 | 85 |
| 25 | 3.2 | 20 | 20 | 80 | 80 | 90 | 45 | 30 |
| 26 | 14.9 | 300 | 300 | 1500 | 1500 | 90 | 30 | 77 |
| 27 | 4.0 | 600 | 600 | 80 | 80 | 90 | 45 | 1 |
| 28 | 4.0 | 550 | 300 | 30 | 30 | 90 | 45 | 0.5 |
| 29 | 4.0 | 20 | 20 | 2300 | 2300 | 90 | 45 | 2 |
| 30 | 4.0 | 20 | 20 | 2300 | 80 | 90 | 45 | 2.8 |
| 31 | — | — | — | — | — | — | — | 0 |

TABLE 2

Table 2: Average Thickness and Characteristics of Surface Coating Layer

| | Average thickness of surface coating layer (μm) | | | | | | Characteristics | |
|---|---|---|---|---|---|---|---|---|
| No. | Sn coating layer | Cu—Sn alloy coating layer | Cu coating layer | Ni coating layer | Cu coating layer | Chamfering of copper plate material | Coefficient of friction | Post-heating contact resistance |
| 1 | 0.7 | 0.3 | 0 | 0.9 | 0 | C chamfer | 0.28 | ○ |
| 2 | 0.7 | 0.3 | 0 | 0.9 | 0 | C chamfer | 0.32 | ○ |
| 3 | 1.5 | 0.4 | 0 | 0.9 | 0 | C chamfer | 0.35 | ○ |
| 4 | 0.7 | 0.3 | 0 | 0.5 | 0 | C chamfer | 0.33 | ○ |
| 5 | 0.2 | 0.1 | 0 | 0.9 | 0 | C chamfer | 0.26 | ○ |
| 6 | 5.0 | 2.6 | 0 | 0.9 | 0 | C chamfer | 0.37 | ○ |
| 7 | 0.7 | 0.3 | 0.1 | 0.9 | 0 | C chamfer | 0.28 | ○ |
| 8 | 4.7 | 2.4 | 0.5 | 0.9 | 0 | C chamfer | 0.38 | ○ |
| 9 | 5.0 | 2.6 | 0 | 0.9 | 0 | C chamfer | 0.39 | ○ |
| 10 | 0.7 | 0.3 | 0 | 10 | 0 | C chamfer | 0.27 | ○ |
| 11 | 0.7 | 0.3 | 0 | 0.9 | 0.2 | C chamfer | 0.29 | ○ |
| 12 | 0.7 | 0.3 | 0 | 0.9 | 3.0 | C chamfer | 0.32 | ○ |
| 13 | 0.7 | 0.3 | 0 | — | 0 | C chamfer | 0.27 | ○ |
| 14 | 0.2 | 0.3 | 0 | 0.9 | 0 | C chamfer | 0.26 | ○ |
| 15 | 4.3 | 0.5 | 0 | 0.9 | 0 | C chamfer | 0.39 | ○ |
| 16 | 0.7 | 0.3 | 0 | 0.9 | 0 | R chamfer | 0.29 | ○ |
| 17 | 0.7 | 0.3 | 0 | 0.9 | 0 | No chamfer | 0.33 | ○ |
| 18 | 0.7 | 0.3 | 0 | 0.9 | 0 | No chamfer | 0.34 | ○ |
| 19 | 0.7 | 0.3 | 0 | 0.9 | 0 | No chamfer | 0.31 | ○ |
| 20 | 0.7 | 0.3 | 0 | 0.9 | 0 | C chamfer | 0.29 | ○ |
| 21 | 0.7 | 0.3 | 0 | 0.9 | 0 | C chamfer | 0.28 | ○ |
| 22 | 0.7 | 0.4 | 0 | 0.9 | 0 | C chamfer | 0.28 | ○ |
| 23 | 0.1 | 0.3 | 0 | 0.9 | 0 | C chamfer | 0.26 | x |
| 24 | 0.05 | 0.3 | 0 | 0.9 | 0 | C chamfer | 0.25 | x |
| 25 | 0.7 | 0.05 | 0 | 0.9 | 0 | C chamfer | 0.28 | x |
| 26 | 0.7 | 0.3 | 0 | 0.9 | 0 | C chamfer | 0.26 | x |
| 27 | 0.7 | 0.3 | 0 | 0.9 | 0 | C chamfer | 0.47 | ○ |
| 28 | 0.7 | 0.3 | 0 | 0.9 | 0 | C chamfer | 0.50 | ○ |
| 29 | 0.7 | 0.3 | 0 | 0.9 | 0 | C chamfer | 0.45 | ○ |
| 30 | 0.7 | 0.3 | 0 | 0.9 | 0 | C chamfer | 0.42 | ○ |
| 31 | 0.6 | 0.4 | 0 | — | 0 | C chamfer | 0.55 | ○ |

* Sn coating layer: Sn—3.5%Ag in No. 20, Sn—2%Bi in No. 21, Sn—0.7%Cu in No. 22, pure Sn in any other test pieces

TABLE 3

Table 3: Status of Surface Coating Layer

| No. | Maximum height roughness Rz (μm) | Shape-forming Sn coating layer: Shape | Shape-forming Sn coating layer: Equivalent circle diameter (μm) | Shape-forming Sn coating layer: Shortest interval (μm) | Intersecting angle in insertion direction (μm) | Exposure area ratio of Cu—Sn coating layer (%) |
|---|---|---|---|---|---|---|
| 32 | 3.2 | Circle | 96 | 80 | — | 21 |
| 33 | 3.2 | Square | 98 | 80 | 90 | 22 |

TABLE 3-continued

Table 3: Status of Surface Coating Layer

| No. | Maximum height roughness Rz (μm) | Shape-forming Sn coating layer: Shape | Shape-forming Sn coating layer: Equivalent circle diameter (μm) | Shape-forming Sn coating layer: Shortest interval (μm) | Intersecting angle in insertion direction (μm) | Exposure area ratio of Cu—Sn coating layer (%) |
|---|---|---|---|---|---|---|
| 34 | 3.2 | Square | 5.3 | 80 | 90 | 13 |
| 35 | 3.2 | Square | 974 | 80 | 90 | 4 |
| 36 | 3.2 | Rectangle | 96 | 80 | 90 | 21 |
| 37 | 3.2 | Rhombus | 92 | 80 | 90 | 18 |

TABLE 4

Table 4: Thickness and Characteristics of Surface Coating Layer

| | Thickness of surface coating layer (μm) | | | | | | Characteristics | |
|---|---|---|---|---|---|---|---|---|
| No. | Sn coating layer | Cu—Sn alloy coating layer | Cu coating layer | Ni coating layer | Cu coating layer | Chamfering of copper plate material | Coefficient of friction | Post-heating contact resistance |
| 32 | 0.7 | 0.3 | 0 | 0.9 | 0 | C chamfer | 0.32 | ○ |
| 33 | 0.7 | 0.3 | 0 | 0.9 | 0 | C chamfer | 0.32 | ○ |
| 34 | 0.7 | 0.3 | 0 | 0.9 | 0 | C chamfer | 0.33 | ○ |
| 35 | 0.7 | 0.3 | 0 | 0.9 | 0 | C chamfer | 0.38 | ○ |
| 36 | 0.7 | 0.3 | 0 | 0.9 | 0 | C chamfer | 0.32 | ○ |
| 37 | 0.7 | 0.3 | 0 | 0.9 | 0 | C chamfer | 0.33 | ○ |

* Pure Sn in all Sn coating layers

Next, the obtained test pieces were tested to assess their coefficients of friction and contact resistances after being left at high temperatures. Table 2 and Table 4 show test results thereby obtained.

[Assessment Test of Coefficient of Friction]

Figure 13:
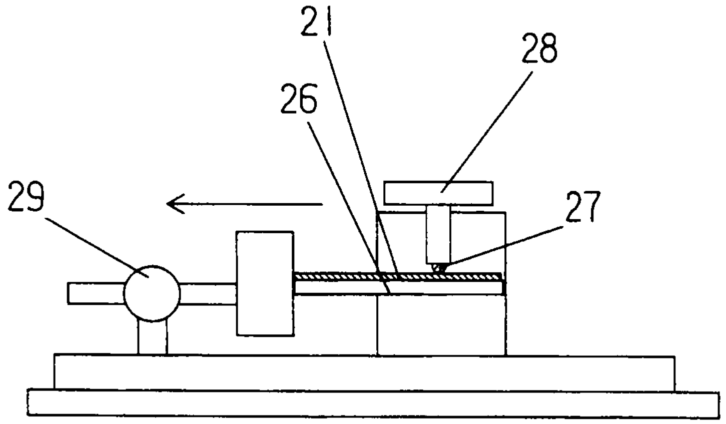
FIG. 13 is a conceptual view of a jig used in a coefficient of friction assessment test in the example.

The shape of an indented portion at an electrical contact in a female terminal coupled with the PCB terminal was simulated and assessed by an apparatus illustrated in FIG. 13. First, PCB terminal test pieces 21 (Nos. 1 to 37) were each secured to a board 26 horizontally placed, and a female test piece 27, which is a semi-circular member (inner diameter: ϕ 1.5 mm) cut out from a copper plate (made of the same material as the PCB terminal test pieces, thickness of 0.25 mm) not yet surface-roughened but already plated (with Cu: 0.15 μm and Sn: 1.0 μm) and reflowed, was placed on each test piece, and the respective coating layers were brought into contact. Then, the female test piece 27 was subjected to the load of 3.0 N (weight 28) so that the test piece 21 was weighed down, and the test piece 21 was horizontally pulled in the terminal insertion direction by a horizontal load tester (Model-2152 manufactured by Aikoh Engineering Co., Ltd) (sliding speed: 80 mm/min) to measure a maximum frictional force F (unit: N) up to the sliding distance of 5 mm. Then, the coefficient of friction was obtained by the following equation (1). Any test pieces with the coefficient of friction equal to or below 0.4 were assessed as having a low coefficient of friction. A reference numeral 29 denotes a load cell, and the arrow indicates a sliding direction).

$$\text{Coefficient of Friction}=F/3.0 \quad (1)$$

[Assessment Test of Post-Heating Contact Resistance]

The respective test pieces were subjected to heat treatment at 160° C. for 500 hours in atmosphere, and contact resistances of the test pieces were measured under the conditions of no-load voltage: 20 mV, current:10 mA, and no sliding movement. The measurement was performed at five different positions, and an average value obtained therefrom was used as a measured value. The test pieces with the contact resistance less than 10 mΩ after being heated at 160° C. for 500 hours were assessed as having a good heat resistance (o), and the test pieces with the contact resistance equal to or larger than 10 mΩ were assessed as having a poor heat resistance (x).

As shown in Table 2, Nos. 1 to 22 and 32 to 37 meet the requirements defined by the present invention for the average thickness of the Sn coating layer and the Cu—Sn alloy coating layer, the status of the Sn coating layer visually confirmed on the surface of each test piece (widths of the Sn coating layer and interval between the Sn coating layers, equivalent circle diameter of the Sn coating layer and interval between the Sn coating layers), and maximum height roughness Rz. These test pieces had such low coefficients of friction as at most 0.4 and post-heating contact resistances equal to or smaller than 10 mΩ.

On the other hand, the Sn coating layers of Nos. 23 and 24 had excessively small average thicknesses (also excessively large exposure area ratios of the Cu—Sn alloy coating layer), the Cu—Sn alloy coating layer of No. 25 had an excessively small average thickness, and No. 26 had an excessively large maximum height roughness Rz, resulting in a high post-heating contact resistance. Nos. 27 and 28 had excessively large widths between the parallel Sn coating layers (and excessively small exposure area ratios of the Cu—Sn alloy coating layer). Nos. 29 and 30, although their Sn-plated coating layers were very thick, showed small values for the exposure area of the Cu—Sn alloy layer because of excessively large intervals between the parallel Sn coating layers, thereby resulting in high coefficients of friction. No. 31, for which the surface roughening was omitted, had a high coefficient of friction.

(Example of Soldering Portion)

On the other hand, the Ni plating, Cu plating, and Sn plating were performed in this order to an entire portion of the copper plate for the soldering portion of the PCB terminal, (Ni plating was partly omitted, and Cu plating was performed prior to Ni plating in some of test pieces). Then, the portion was reflowed at 280° C. for 10 seconds and then partly subjected the Sn plating again and cut out into PCB terminals so that PCB terminal test pieces Nos. 38 to 65 were obtained. The soldering portions of Nos. 56 to 60, 64, and 65 were surface-roughened in the same manner as No. 1 after the press cutting.

Tables 5 and 6 show average thicknesses of the respective coating layers of the test pieces, and whether the surface roughening and chamfering were performed. The test pieces Nos. 38 to 48 were subjected to the bilateral cutting, No. 49 was subjected to the unilateral cutting, and No. 50 was subjected to the bilateral cutting and then chamfered to only remove burrs. As illustrated in FIG. 8, the soldering portion of the PCB terminal is die-cut together with the fitting portion. In the PCB terminal test pieces of Nos. 38 to 65, however, newly die-cut pieces were used in place of the soldering portions of the PCB terminal test pieces of Nos. 1 to 37.

The average thicknesses of the respective coating layers of the test pieces were measured in the same manner as described above. The average thicknesses of the post-reflow Sn plating layers were measured as described below.

[Average Thickness of Post-Reflow Sn Plating Layer]

As to the measurement of the Sn plating layer formed after the reflow treatment, the base material was cut in cross section orthogonal to the longitudinal direction of the terminal by a microtome (three positions for one test piece), and thickness of the Sn plating layer in each test piece near the center of an upper surface thereof in cross section (upper surface when die-cut) were measured by the SEM (scanning electron microscope) at the magnifying scale of 10,000. Then, an average thickness of these three sectional surfaces was calculated.

TABLE 5

Table 5: Average Thickness and Characteristics of Surface Coating Layer

| No. | Average thickness of surface coating layer (μm): Sn coating layer | Cu—Sn, Ni—Sn alloy coating layer | Cu coating layer | Ni coating layer | Cu coating layer | Copper plate material: Surface roughening | Chamfering of copper plate material | Type of solder | Solderability time (sec) |
|---|---|---|---|---|---|---|---|---|---|
| 38 | 1.0 | Ni—Sn 0.2 | 0 | 0.9 | 0 | Not roughened | C chamfer | Sn—3Ag—0.5Cu | 0.9 |
| 39 | 1.0 | Ni—Sn 0.2 | 0 | 0.9 | 3 | Not roughened | C chamfer | Sn—3Ag—0.5Cu | 0.9 |
| 40 | 0.2 | Ni—Sn 0.1 | 0 | 0.9 | 0 | Not roughened | C chamfer | Sn—3Ag—0.5Cu | 1.9 |
| 41 | 10 | Ni—Sn 0.2 | 0 | 10 | 0 | Not roughened | C chamfer | Sn—3Ag—0.5Cu | 0.7 |
| 42 | 5 | Ni—Sn 3.0 | 0 | 3 | 0 | Not roughened | C chamfer | Sn—3Ag—0.5Cu | 0.9 |
| 43 | 1.3 | Cu—Sn 0.3 | 0.1 | 0.9 | 0 | Not roughened | C chamfer | Sn—3Ag—0.5Cu | 0.9 |
| 44 | 1.5 | Cu—Sn 0.3 | 0.5 | 0.9 | 0 | Not roughened | C chamfer | Sn—3Ag—0.5Cu | 0.9 |
| 45 | 1.0 | Cu—Sn 0.3 | 0 | 0.9 | 0 | Not roughened | C chamfer | Sn—3Ag—0.5Cu | 0.9 |
| 46 | 0.5 | Cu—Sn 0.3 | 0 | 0 | 0 | Not roughened | C chamfer | Sn—3Ag—0.5Cu | 1.1 |
| 47 | 1.0 | Ni—Sn 0.2 | 0 | 0.9 | 0 | Not roughened | R chamfer | Sn—3Ag—0.5Cu | 1.0 |
| 48 | 1.0 | Ni—Sn 0.2 | 0 | 0.9 | 0 | Not roughened | Not roughened | Sn—3Ag—0.5Cu | 1.4 |
| 49 | 1.0 | Ni—Sn 0.2 | 0 | 0.9 | 0 | Not roughened | Not roughened | Sn—3Ag—0.5Cu | 1.5 |
| 50 | 1.0 | Ni—Sn 0.2 | 0 | 0.9 | 0 | Not roughened | Removal of burr only | Sn—3Ag—0.5Cu | 1.3 |
| 51 | 0.2 + post-reflow plating 0.1 | Ni—Sn 0.2 | 0 | 0.9 | 0 | Not roughened | C chamfer | Sn—3Ag—0.5Cu | 1.5 |
| 52 | 1.0 + post-reflow plating 0.5 | Cu—Sn 0.5 | 0 | 0 | 0 | Not roughened | C chamfer | Sn—3Ag—0.5Cu | 1.0 |

* Pure Sn in all Sn coating layers

TABLE 6

Table 6: Average Thickness and Characteristics of Surface Coating Layer

| No. | Average thickness of surface coating layer (μm): Sn coating layer | Cu—Sn, Ni—Sn alloy coating layer | Cu coating layer | Ni coating layer | Cu coating layer | Copper plate material: Surface roughening | Chamfering of copper plate material | Type of solder | Solderability time (sec) |
|---|---|---|---|---|---|---|---|---|---|
| 53 | 1.0 | Ni—Sn 0.2 | 0 | 0.9 | 0 | Not roughened | C chamfer | Sn—3Ag—0.5Cu | 0.9 |
| 54 | 1.0 | Ni—Sn 0.2 | 0 | 0.9 | 0 | Not roughened | C chamfer | Sn—3Ag—0.5Cu | 0.9 |
| 55 | 1.0 | Ni—Sn 0.2 | 0 | 0.9 | 0 | Not roughened | C chamfer | Sn—3Ag—0.5Cu | 1.0 |
| 56 | 1.0 | Ni—Sn 0.2 | 0 | 0.9 | 0 | Roughened (No. 1) | C chamfer | Sn—3Ag—0.5Cu | 1.0 |
| 57 | 1.0 | Cu—Sn 0.4 | 0 | 0.9 | 0 | Roughened (No. 1) | C chamfer | Sn—3Ag—0.5Cu | 1.1 |
| 58 | 0.5 | Cu—Sn 0.4 | 0 | 0 | 0 | Roughened (No. 1) | C chamfer | Sn—3Ag—0.5Cu | 1.2 |
| 59 | 1.0 + post-reflow plating 0.5 | Ni—Sn 0.2 | 0 | 0.9 | 0 | Roughened (No. 1) | C chamfer | Sn—3Ag—0.5Cu | 1.1 |
| 60 | 0.2 + post-reflow plating 0.2 | Cu—Sn 0.4 | 0 | 0 | 0 | Roughened (No. 1) | C chamfer | Sn—3Ag—0.5Cu | 1.5 |
| 61 | 1.0 | Ni—Sn 0.2 | 0 | 0.9 | 0 | Not roughened | C chamfer | Sn—40Pb | 1.0 |
| 62 | 0.1 | Ni—Sn 0.2 | 0 | 0.9 | 0 | Not roughened | C chamfer | Sn—3Ag—0.5Cu | 3.0 |
| 63 | 0.1 | Cu—Sn 0.3 | 0 | 0.9 | 0 | Not roughened | C chamfer | Sn—3Ag—0.5Cu | 2.5 |
| 64 | 0.1 | Ni—Sn 0.2 | 0 | 0.9 | 0 | Roughened (No. 1) | C chamfer | Sn—3Ag—0.5Cu | 3.5 |

TABLE 6-continued

Table 6: Average Thickness and Characteristics of Surface Coating Layer

| | Average thickness of surface coating layer (μm) | | | | | Copper plate material | | | |
|---|---|---|---|---|---|---|---|---|---|
| No. | Sn coating layer | Cu—Sn, Ni—Sn alloy coating layer | Cu coating layer | Ni coating layer | Cu coating layer | Surface roughening | Chamfering of copper plate material | Type of solder | Solderability time (sec) |
| 65 | 0.1 | Cu—Sn 0.3 | 0 | 0.9 | 0 | Roughened (No. 1) | C chamfer | Sn—3Ag—0.5Cu | 3.0 |

* Sn coating layer: Sn—3.5%Ag in No. 53, Sn—2%Bi in No. 54, Sn—0.7%Cu in No. 55, Sn—0.7Cu in No. 61, pure Sn in any other test piece Next, the solderability time of each of each test piece thus obtained was measured. Tables 5 and 6 show test results thereby obtained.

[Solderability Test]

The test pieces Nos. 38 to 65 were dipped in non-active soldering flax for one second to be coated therewith, and the solderability time of each test piece was measured by a Meniscograph technique. The solders used were a Sn-3.0 Ag-0.5Cu solder at 255° C., and a Sn-40Pb solder at 245° C. The test conditions provided were; dipping speed: 25 mm/sec, dipping depth: 5 mm, and dipping time: 5 sec. Test pieces with the solderability time equal to or less than 2 seconds were assessed as having good solderability.

As shown in Tables 5 and 6, the test pieces Nos. 38 to 61 had the average thickness of the Sn coating layer and the post-reflow Sn plating layer in total was at least 0.2 μm, therefore met the requirement defined by the present invention. Further, these test pieces all exhibited such remarkable solderability as the solderability time equal to or less than 2 seconds.

Any of the test pieces Nos. 62 to 65, in which the average thickness of the Sn coating layer was below 0.2 μm and there was no post-reflow Sn plating layer, had long solderability time and poor solderability.

What is claimed is:

1. A PCB terminal manufactured by die-cutting a copper plate (meaning cupper plate or cupper alloy plate hereinafter) into a predetermined shape and then subjecting the resulting copper plate to a tin plating (meaning tin plating or tin alloy plating hereinafter) and a reflow treatment, the PCB terminal comprising: a fitting portion formed on one end to be inserted in a counterpart terminal; a soldering portion formed on the other end to be soldered to a circuit board; and an intermediate portion formed between the fitting portion and the soldering portion, wherein a Cu—Sn alloy coating layer and a Sn coating layer are formed as a surface coating layer on the fitting portion in this order, the Sn coating layer is smoothened by the reflow treatment, a part of the Cu—Sn alloy coating layer is exposed on an outermost surface, the Cu—Sn alloy coating layer has an average thickness of 0.1 to 3 μm, and the Sn coating layer has an average thickness of 0.2 to 5.0 μm, and the Sn coating layer includes a group of Sn coating layers having a width of 1 to 500 μm that are a plurality of essentially parallel lines, the Cu—Sn alloy coating layer are adjacently formed on both sides of the Sn coating layers each constituting the group of Sn coating layers, the adjacent Sn coating layers included in the group of Sn coating layers have an interval of 1 to 2000 μm therebetween, and a maximum height roughness Rz in a terminal insertion direction is at most 10 μm.

2. The PCB terminal according to claim 1, wherein a portion of the die-cut copper plate for the fitting portion is subjected to a surface roughening treatment before the tin plating, and the surface roughening treatment is a press working to form the plurality of essentially parallel lines, wherein the plurality of essentially parallel lines are concave.

3. The PCB terminal according to claim 1, wherein corner portions of the die-cut copper plate of the fitting portion are subjected to round chamfer or C chamfer by a press working along the terminal insert direction.

4. The PCB terminal according to claim 1, wherein an exposure area ratio of the Cu—Sn alloy coating layer is 3 to 75%.

5. The PCB terminal according to claim 1, wherein an Ni coating layer having an average thickness equal to or smaller than 10 μm is formed between the surface of the die-cut copper plate and the Cu—Sn alloy coating layer.

6. The PCB terminal according to claim 5, wherein a Cu coating layer having an average thickness equal to or smaller than 5 μm is further formed between the Ni coating layer and the Cu—Sn alloy coating layer.

7. The PCB terminal according to claim 5, wherein a Cu coating layer having an average thickness equal to or smaller than 5 μm is further formed between the surface of the die-cut copper plate and the Ni coating layer.

8. A PCB terminal manufactured by die-cutting a copper-plate (meaning cupper plate or cupper alloy plate hereinafter) into a predetermined shape and then subjecting the resulting copper plate to a tinplating (meaning tin plating or tin alloy plating hereinafter) and a reflow treatment, the PCB terminal comprising: a fitting portion formed on one end to be inserted in a counterpart terminal; a soldering portion formed on the other end to be soldered to a circuit board; and an intermediate portion formed between the fitting portion and the soldering portion, wherein a Cu—Sn alloy coating layer and a Sn coating layer are formed as a surface coating layer on the fitting portion in this order, the Sn coating layer is smoothened by the reflow treatment, a part of the Cu—Sn alloy coating layer is exposed on an outermost surface, the Cu—Sn alloy coating layer has an average thickness of 0.1 to 3 μm, and the Sn coating layer has an average thickness of 0.2 to 5.0 μm, and the Sn coating layer includes a first group of Sn coating layers having a width of 1 to 500 μm that are a plurality of essentially parallel lines and further includes, apart from the first group of Sn coating layers, one or at least two second groups of Sn coating layers having a width of 1 to 500 μm that are a plurality of essentially parallel lines, the first and second groups of Sn coating layers intersect with each other in a grid pattern, the Cu—Sn alloy coating layers are adjacently formed on both sides of the Sn coating layers each constituting the respective groups of Sn coating layers, the adjacent Sn coating layers included in the same group of Sn coating layers have an interval of 1 to 2000 μm therebetween, and a maximum height roughness Rz in a terminal insertion direction is at most 10 μm.

9. The PCB terminal according to claim 8, wherein a portion of the die-cut copper plate for the fitting portion is subjected to a surface roughening treatment before the tin plating, and the surface roughening treatment is a press working to form the plurality of essentially parallel lines, wherein the plurality of essentially parallel lines are concave.

10. The PCB terminal according to claim 8, wherein corner portions of the die-cut copper plate of fitting portion are subjected to round chamfer or C chamfer by a press working along the terminal insert direction.

11. The PCB terminal according to claim 8, wherein an exposure area ratio of the Cu—Sn alloy coating layer is 3 to 75%.

12. The PCB terminal according to claim 8, wherein an Ni coating layer having an average thickness equal to or smaller than 10 μm is formed between the surface of the die-cut copper plate and the Cu—Sn alloy coating layer.

13. The PCB terminal according to claim 12, wherein a Cu coating layer having an average thickness equal to or smaller than 5 μm is further formed between the Ni coating layer and the Cu—Sn alloy coating layer.

14. The PCB terminal according to claim 12, wherein a Cu coating layer having an average thickness equal to or smaller than 5 μm is further formed between the surface of the die-cut copper plate and the Ni coating layer.

15. A PCB terminal manufactured by die-cutting a copper-plate (meaning cupper plate or cupper alloy plate hereinafter) into a predetermined shape and then subjecting the resulting copper plate to a tin plating (meaning tin plating or tin alloy plating hereinafter) and a reflow treatment, the PCB terminal comprising: a fitting portion formed on one end to be inserted in a counterpart terminal; a soldering portion formed on the other end to be soldered to a circuit board; and an intermediate portion formed between the fitting portion and the soldering portion, wherein a Cu—Sn alloy coating layer and a Sn coating layer are formed as a surface coating layer on the fitting portion in this order, the Sn coating layer is smoothened by the reflow treatment, a part of the Cu—Sn alloy coating layer is exposed on an outermost surface, the Cu—Sn alloy coating layer has an average thickness of 0.1 to 3 μm, and the Sn coating layer has an average thickness of 0.2 to 5.0 μm, and the Sn coating layer includes a group of Sn coating layers having an equivalent circle diameter of 5 to 1000 μm that are a plurality of shapes each formed by a closed contour, the Cu—Sn coating layer is formed around the Sn coating layers each constituting the group of Sn coating layers so as to surround the Sn coating layers, most proximate Sn coating layers included in the group of Sn coating layers have an interval of 1 to 2000 μm therebetween, and a maximum height roughness Rz in a terminal insertion direction is at most 10 μm.

16. The PCB terminal according to claim 15, wherein a portion of the die-cut copper plate for the fitting portion is subjected to a surface roughening treatment before the tin plating, and the surface roughening treatment is a press working to form the plurality of shapes, wherein the plurality of shapes are concave each formed by a closed contour.

17. The PCB terminal according to claim 15, wherein corner portions of the copper plate of the fitting portion are subjected to round chamfer or C chamfer by a press working along the terminal insert direction.

18. The PCB terminal according to claim 15, wherein an exposure area ratio of the Cu—Sn alloy coating layer is 3 to 75%.

19. The PCB terminal according to claim 15, wherein an Ni coating layer having an average thickness equal to or smaller than 10 μm is formed between the surface of the die-cut copper plate and the Cu—Sn alloy coating layer.

20. The PCB terminal according to claim 19, wherein a Cu coating layer having an average thickness equal to or smaller than 5 μm is further formed between the Ni coating layer and the Cu—Sn alloy coating layer.

21. The PCB terminal according to claim 19, wherein a Cu coating layer having an average thickness equal to or smaller than 5 μm is further formed between the surface of the die-cut copper plate and the Ni coating layer.

22. The PCB terminal according to any one of claims 1, 8, or 15, wherein a Sn coating layer having an average thickness of 0.2 to 10 μm and smoothened by the reflow treatment is formed on the soldering portion.

23. The PCB terminal according to claim 22, wherein a Cu—Sn alloy coating layer or an Ni—Sn alloy coating layer having an average thickness equal to or smaller than 3 μm is formed between the Sn coating layer of the soldering portion and the surface of the die-cut copper plate.

24. The PCB terminal according to claim 23, wherein an Ni coating layer having an average thickness equal to or smaller than 10 μm is formed between one of the Cu—Sn alloy coating layer or the Ni—Sn alloy coating layer, and the surface of the die-cut copper plate.

25. The PCB terminal according to claim 24, wherein a Cu coating layer having an average thickness equal to or smaller than 5 μm is formed between the Ni coating layer and the Cu—Sn alloy coating layer.

26. The PCB terminal according to claim 24, wherein a Cu coating layer having an average thickness equal to or smaller than 5 μm is formed between the surface of the die-cut copper plate and the Ni coating layer.

27. The PCB terminal according to claim 22, wherein corner portions of the die-cut copper plate of the soldering portion are subjected to round chamfer or C chamfer by a press working along the terminal insert direction.

28. The PCB terminal according to claim 22, wherein a Sn plating layer having an average thickness equal to or smaller than 0.3 μm and not subjected to the reflow treatment is further formed on an outermost surface, and an average thickness of the Sn plating layer and the Sn coating layer smoothened by the reflow treatment in total is 0.2 to 10 μm.

29. The PCB terminal according to any one of claims 1, 8, or 15, wherein the soldering portion has a surface coating layer configured equally to the surface coating layer of the fitting portion.

30. The PCB terminal according to any one of claims 1, 8, or 15, wherein the intermediate portion is not provided with a surface coating layer.

31. The PCB terminal according to claim 30, wherein corner portions of the die-cut copper plate of the intermediate portion are subjected to round chamfer or C chamfer by a press working along the terminal insert direction.

32. The PCB terminal according to any one of claims 1, 8, or 15, wherein the intermediate portion is coated with one or at least two of the Sn coating layer, the Ni coating layer, the Cu coating layer, and the Cu—Sn alloy coating layer.

33. The PCB terminal according to claim 32, wherein corner portions of the die-cut copper plate of the intermediate portion are subjected to round chamfer or C chamfer by a press working along the terminal insert direction.

34. A method for manufacturing the PCB terminal according to any one of claims 1, 8, or 15, wherein the copper plate is subjected to the surface roughening treatment by the press working alongside, before, or after the die cutting so that a plurality of recesses are formed thereon, and the roughened surface of the copper plate is subjected to the tin plating and thereafter the reflow treatment.

35. A method for manufacturing the PCB terminal according to claim 28, wherein a fitting portion of the copper plate is subjected to the surface roughening treatment by the press working alongside, before, or after the die cutting so that a plurality of recesses are formed thereon, and the roughened surface of the copper plate is subjected to the tin plating and thereafter the reflow treatment, and then further subjected to Sn plating.

* * * * *